(12) United States Patent
Khoury

(10) Patent No.: US 7,821,440 B2
(45) Date of Patent: *Oct. 26, 2010

(54) SYSTEM AND METHOD OF ALTERING A PWM CARRIER POWER SPECTRUM

(75) Inventor: John M. Khoury, Basking Ridge, NJ (US)

(73) Assignee: Silicon Laboratories, Inc., Austin, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/543,888

(22) Filed: Aug. 19, 2009

(65) Prior Publication Data

US 2009/0309654 A1    Dec. 17, 2009

Related U.S. Application Data

(63) Continuation of application No. 12/126,125, filed on May 23, 2008, now Pat. No. 7,598,895.

(60) Provisional application No. 61/072,563, filed on Apr. 1, 2008.

(51) Int. Cl.
*H03M 1/82* (2006.01)

(52) U.S. Cl. .............. 341/152; 381/104; 455/127.3; 375/238

(58) Field of Classification Search ............ 341/152; 375/238; 381/104; 455/127.3
See application file for complete search history.

(56) References Cited

U.S. PATENT DOCUMENTS

| | | | | | |
|---|---|---|---|---|---|
| 5,014,016 | A | * | 5/1991 | Anderson | 330/10 |
| 5,247,581 | A | * | 9/1993 | Gurcan | 381/321 |
| 5,389,829 | A | * | 2/1995 | Milazzo | 327/172 |
| 5,798,672 | A | * | 8/1998 | Masini et al. | 330/251 |
| 5,872,998 | A | * | 2/1999 | Chee | 710/56 |
| 6,097,249 | A | * | 8/2000 | Strickland et al. | 330/10 |
| 6,127,885 | A | * | 10/2000 | Colangelo | 330/10 |
| 6,160,455 | A | * | 12/2000 | French et al. | 330/297 |

(Continued)

OTHER PUBLICATIONS

Kempski, A., et al., "Decompostion of EMI Noise into Common and Differential Modes in PWM Inventer Drive System", Electrical Power Quality and Utilization Journal, V. XII, N. 1, (2006). 6 pgs.

(Continued)

*Primary Examiner*—Jean B Jeanglaude
(74) *Attorney, Agent, or Firm*—Polansky & Associates, P.L.L.C.; R. Michael Reed

(57) ABSTRACT

In a particular embodiment, a circuit device includes an input to receive a pulse-width modulated (PWM) signal and an output to send a modulated PWM signal. The circuit device further includes a pulse edge control circuit coupled between the input and the output. The pulse edge control circuit receives the PWM signal via the input and includes a control input to receive a modulation control signal. The pulse edge control circuit is adapted to modify the PWM signal to provide the modulated PWM signal with suppressed carrier power and associated harmonics to the output based on the modulation control signal. The circuit device further includes a modulation sequence controller adapted to provide the modulation control signal via the control input. The modulation control signal selectively controls a sequence of the modification of the PWM signal to selectively alter an output power spectrum of the modulated PWM signal.

35 Claims, 20 Drawing Sheets

U.S. PATENT DOCUMENTS

| | | | |
|---|---|---|---|
| 6,297,692 B1 * | 10/2001 | Nielsen | 330/10 |
| 6,552,606 B1 * | 4/2003 | Veltman et al. | 330/10 |
| 6,552,607 B1 * | 4/2003 | Danielson | 330/10 |
| 6,563,377 B2 * | 5/2003 | Butler | 330/10 |
| 6,594,309 B1 * | 7/2003 | Botti et al. | 375/238 |
| 6,597,240 B1 * | 7/2003 | Walburger et al. | 330/10 |
| 6,653,897 B2 * | 11/2003 | Sawashi | 330/10 |
| 6,794,932 B1 * | 9/2004 | Butler | 330/10 |
| 6,847,257 B2 * | 1/2005 | Edwards et al. | 330/10 |
| 7,046,080 B2 * | 5/2006 | Watts et al. | 330/10 |
| 7,068,095 B2 | 6/2006 | Bernardon | |
| 7,078,964 B2 | 7/2006 | Risbo et al. | |
| 7,119,629 B2 | 10/2006 | Nielsen et al. | |
| 7,142,049 B2 | 11/2006 | Kirn | |
| 7,142,050 B2 | 11/2006 | Risbo | |
| 7,190,224 B2 | 3/2007 | Sutardja | |
| 7,218,173 B2 | 5/2007 | Nalbant | |
| 7,230,485 B2 | 6/2007 | De Cremoux et al. | |
| 7,242,248 B1 | 7/2007 | Sutardja | |
| 7,262,658 B2 | 8/2007 | Ramaswamy et al. | |
| 7,279,965 B2 | 10/2007 | Hansen et al. | |
| 7,298,209 B1 | 11/2007 | Sutardja | |
| 7,301,417 B2 | 11/2007 | Shinohara | |
| 7,332,962 B2 | 2/2008 | Wu et al. | |
| 2003/0020539 A1 | 1/2003 | Sawashi | |
| 2003/0067348 A1 | 4/2003 | Butler | |
| 2003/0122615 A1 | 7/2003 | Zeff | |
| 2004/0169552 A1 | 9/2004 | Butler | |
| 2004/0232978 A1 | 11/2004 | Easson et al. | |
| 2004/0232979 A1 | 11/2004 | Edwards et al. | |
| 2005/0054307 A1 | 3/2005 | Watts et al. | |
| 2005/0083114 A1 | 4/2005 | Risbo | |
| 2005/0083115 A1 | 4/2005 | Risbo | |
| 2005/0083116 A1 | 4/2005 | Risbo et al. | |
| 2005/0099231 A1 | 5/2005 | Sutardja | |
| 2005/0116770 A1 | 6/2005 | Kirn | |
| 2005/0200404 A1 | 9/2005 | Bernardon | |
| 2006/0008095 A1 | 1/2006 | Tsuji | |
| 2006/0077007 A1 | 4/2006 | De Cremoux et al. | |
| 2006/0103458 A1 | 5/2006 | Hansen et al. | |
| 2006/0226904 A1 | 10/2006 | Nalbant | |
| 2006/0279354 A1 | 12/2006 | Hansen et al. | |
| 2007/0002943 A1 | 1/2007 | Midya | |
| 2007/0024365 A1 | 2/2007 | Ramaswamy et al. | |
| 2007/0146069 A1 | 6/2007 | Wu et al. | |
| 2007/0229159 A1 | 10/2007 | Krishnan et al. | |
| 2008/0042743 A1 | 2/2008 | Wong et al. | |

OTHER PUBLICATIONS

Ogasawara, S., et al., "Suppression of Common Mode Voltage in a PWM Rectifier/Inverter System", Dept. of Electrical Engineering, Tokyo Institute of Technology, IEEE, (2001), 2015-2021.

* cited by examiner

US 7,821,440 B2

SYSTEM AND METHOD OF ALTERING A PWM CARRIER POWER SPECTRUM

CROSS-REFERENCE TO RELATED APPLICATION(S)

This application is continuation application of and claims priority from U.S. patent application Ser. No. 12/126,125 filed on May 23, 2008 now U.S Pat. No. 7,598,895 entitled "SYSTEM AND METHOD OF ALTERING A PWM CARRIER POWER SPECTRUM," which is a non-provisional application of and claims priority from Provisional Patent Application No. 61/072,563, filed Apr. 1, 2008, and entitled "COMMON MODE CARRIER SUPPRESSION AND SPECTRAL SHAPING IN CLASS D AMPLIFIERS," both of which are incorporated herein in their entireties.

FIELD OF THE DISCLOSURE

The present disclosure is generally related to a system and method of altering a PWM carrier power spectrum.

BACKGROUND

In general, class D audio amplifiers have the benefit of high power efficiency. However, such amplifiers also have a major drawback in terms of electromagnetic interference (EMI), which can interfere with nearby wireless receivers, violate FCC emission limits, introduce noise into various signal paths, or any combination thereof. In a particular example related to audio amplifiers, audio class D amplifiers switch at a frame rate of a few hundred kHz. In a particular example, switching frequencies for audio applications can range from approximately 200 kHz to 1000 kHz. In class D amplifiers, the resulting carrier and its harmonics due to such switching often overlap with the amplitude modulated (AM) frequency band, which ranges from approximately 520 kHz to 1710 kHz AM band. Thus, the class D amplifier may cause EMI that can "jam" nearby AM receivers unless some "mitigation" techniques are used. Class D amplifiers can also be used in connection with switched power supplies, data converters, motor controllers, other systems that use pulse-width modulation, or any combination thereof. In each such instance, the class D amplifiers can generate electromagnetic interference (EMI) and can interfere with AM frequency bands.

In general, class D amplifiers can use a variety of modulation techniques. One common modulation technique is referred to as "BD style" pulse width modulation (PWM). In general, BD-D style PWM includes varying the pulse width of two pulse waves that are aligned in phase and often centered within a pulse width modulated (PWM) frame. For positive input signals, a pulse width of the input signal (typically referred to as P) that drives the high side of a bridged output is increased, while a pulse width of the signal that drives the low side (typically referred to as N) of the bridged output is reduced. Unfortunately, such BD modulation results in the common mode carrier frequency being centered inconveniently at the frame rate. In a particular example where the switching frequencies for audio applications overlap with the AM band, the common mode carrier and its harmonics can radiate interference in the AM frequency band, jamming reception of an AM radio in close proximity or within the same system.

One technique employed in the prior art for mitigating AM radio interference includes adjusting the PWM carrier signal away from the desired radio station frequency. While such adjustments may avoid jamming of a co-resident AM radio, it is not practical for avoiding jamming a non co-resident AM radio (since the desired radio frequency may not be known) and does not help suppress EMI for emission compliance. Further, a technique employed in the prior art for suppressing EMI for emission compliance includes dithering the frequency of the PWM carrier signal. However, the dithering technique provides modest EMI suppression and can adversely impact the integrity of the baseband signal and limit a maximum modulation index of the signal. Therefore, it is desirable to meaningfully suppress the PWM carrier signal power with little or no compromise in the baseband signal performance.

SUMMARY

In a particular embodiment, a circuit device includes at least one input to receive a pulse-width modulated (PWM) signal and at least one output to send a modulated PWM signal. The circuit device further includes a pulse edge control circuit coupled between the at least one input and the at least one output. The pulse edge control circuit receives the PWM signal via the at least one input and includes a control input to receive a modulation control signal. The pulse edge control circuit is adapted to modify the PWM signal to provide the modulated PWM signal with suppressed carrier power and associated harmonics to the at least one output based on the modulation control signal. The circuit device further includes a modulation sequence controller adapted to provide the modulation control signal via the control input. The modulation control signal selectively controls a sequence of the modification of the PWM signal to selectively alter an output power spectrum of the modulated PWM signal.

In another particular embodiment, a circuit device includes at least one input to receive a pulse width modulated (PWM) signal and a pulse edge control circuit coupled to the at least one input. The pulse edge control circuit is adapted to phase-shift or chop the PWM signal to produce a modulated PWM signal with suppressed carrier power and associated harmonics. The circuit device further includes a modulation sequence controller to selectively apply one or more modulation control sequences to a phase-shifting or chopping operation to selectively alter an output PWM power spectrum of the PWM signal and to provide a modulated PWM output signal to at least one output. The modulated PWM output signal has at least one of a reduced carrier power and a reduced interference at particular frequencies.

In still another particular embodiment, a circuit device includes a differential switching amplifier having at least one positive input and at least one negative input and a differential output coupled to a load. The circuit device further includes a pulse edge control circuit coupled to the at least one positive input and to the at least one negative input of the switching amplifier. The pulse edge control circuit includes a differential signal input to receive differential PWM signals and includes a modulation control input to receive a modulation control signal. The pulse edge control circuit is adapted to phase-shift or chop the differential PWM signals to produce a modulated PWM output signal with suppressed common mode carrier power and associated harmonics without altering a differential mode characteristic of the modulated PWM output signal. The circuit device further includes a modulation sequence controller that is coupled to the modulation control input to selectively control a sequencing of the phase-shifting or chopping operation to selectively alter a common mode power spectrum of the modulated PWM output signal.

In yet another particular embodiment, a method is disclosed that includes receiving a pulse-width modulated (PWM) signal and modifying the PWM signal to produce a modulated PWM signal with suppressed carrier power and associated harmonics. The method further includes selectively controlling a modification sequence associated with producing the modulated PWM signal to selectively alter a PWM carrier power spectrum to produce a modulated PWM output signal having at least one of a reduced peak carrier power and a reduced interference at selected frequencies.

DETAILED DESCRIPTION OF ILLUSTRATIVE EMBODIMENTS

Figure 1:
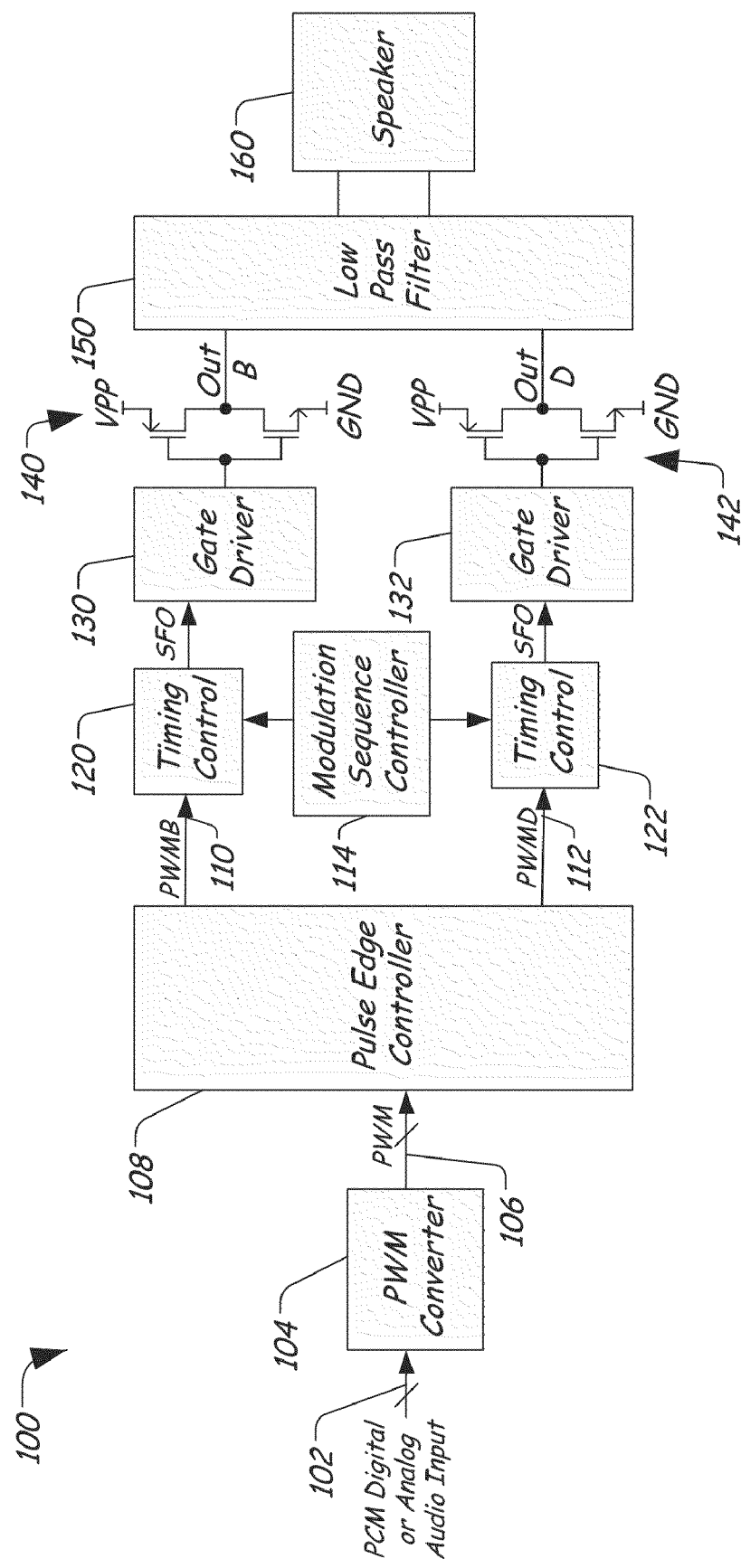
FIG. 1 is a block diagram of a particular illustrative embodiment of a system to alter a PWM carrier power spectrum.

FIG. 1 is a block diagram of a particular illustrative embodiment of a system 100 to alter a common mode carrier power spectrum. The system 100 includes an input 102 to receive a pulse-code-modulated (PCM) digital audio input signal. The input 102 is coupled to a pulse-width modulated (PWM) converter 104, which converts the audio input signal into a PWM word 106 and which provides the PWM word 106 to a pulse edge controller 108. The pulse edge controller 108 outputs a PWM B signal 110 and a PWM D signal 112 to first and second timing control blocks 120 and 122, respectively. The first timing control block 120 receives the PWM B signal 110 and drives one or more gate drivers 130 for output transistors coupled together between a supply voltage (Vpp) and ground (GND), generally indicated at 140, to provide a high side output signal (OUTB). Note that while simple CMOS inverters are shown, more complex output circuit topologies are often used. The second timing control block 122 receives the PWM D signal 112 and drives one or more gate drivers 132 for output transistors coupled together between a supply voltage (Vpp) and ground (GND), generally indicated at 142, to provide a low side output signal (OUTD). The high side (OUTB) and low side (OUTD) signals are provided to a speaker 160 through a demodulation low pass filter (LPF) 150. In a particular example, the demodulation LPF 150 can include two series inductors and cross-coupled capacitors. Additionally, the system 100 includes modulation sequence controller 114 that is coupled to the first and second timing control blocks 120 and 122 to selectively apply one or more modulation sequences to the PWM B and PWM D signals 110 and 112.

In a particular embodiment, the first and second timing control blocks 120 and 122 are adapted to suppress a common mode carrier power and associated harmonics of the digital PWM signal 106 of a class-BD double-sided modulated signal while maintaining other benefits of the class-BD structure. As explained below, the first and second timing control blocks 120 and 122 can be adapted to suppress a carrier power and associated harmonics of the digital PWM signal 106 without altering its carrier frequency using any of various methods, including but not limited to half frame-centered symmetrical pulse shifting, quarter frame-centered symmetrical pulse shifting, quarter frame-centered asymmetrical pulse shifting with no wrap around, or quarter frame-centered symmetrical pulse shifting with wrap around.

In a particular example, half frame-centered symmetrical pulse shifting includes phase shifting the half frame-centered PWM data signals (B and D) by T/2 periodically every nth frame, where the variable "n" is a positive integer. In a particular example, the variable "n" can be a non-integer number, a positive number, or an integer. By limiting the variable "n" to positive integer values, creation of other practical problems, such as undesired noise can be avoided. A basic Fourier Transform analysis would show that the common mode carrier power at the frame rate ($F_C$), and its harmonic multiples are suppressed while sidebands are created at harmonic frequencies according to the following equation:

$$\text{sidebands} = i*F_C \pm \frac{F_C}{n}, \qquad \text{Equation 1}$$

where "i" represents the i-th harmonic. This particular periodic modulation sequence is helpful when it is desired to locate the common mode tones created by the amplifier at an arbitrary frequency to avoid interference in an AM radio frequency band. In a particular illustrative example, the phase of the half frame-centered signal can be shifted by T/2 every second frame (n=2) and the sidebands will be created at $i*0.5*F_C$ and $i*1.5*F_C$.

In another embodiment, the first and second timing control blocks 120 and 122 can be adapted to operate in a quarter frame-centered symmetrical pulse shifting with wrap around mode. In this mode, the BD PWM pulses can be centered at the quarter frame position rather than the center frame position (i.e., at T/4). In nominal BD modulation, the D pulse (as well as the B pulse) is centered within the frame. In general, if the PWM D pulse has a width that is less than T/2 locating the center of the pulse at +/−T/4 does not create any frame edge boundary problems. However, if the width of the PWM D pulse is greater than T/2, locating the center of the pulse at +/−T/4 can create boundary problems at the frame edge. With wrap around, when a PWM pulse that is wider than T/2 is shifted by −T/4, any portion of the pulse that would fall into the previous frame (i.e., that would cross the frame boundary) is placed at the end of the current frame (i.e., is wrapped around). Similarly, when a pulse width that is wider than T/2 is shifted by +T/4, any portion of the pulse that would cross the frame boundary into the next frame is placed at the beginning of the current frame. For carrier suppression, the PWM D signal 112 is shifted left then right (the "DLR" case) over a two frame interval, shifting the D pulse early (to the left) by T/4 in the first frame and late (to the right) by T/4 in the second frame. Similarly, the PWM D signal 112 is shifted right then left (the "DRL" case) over a two-frame interval, shifting the first pulse to the right and the second pulse to the left by T/4. Further, it should be noted that the PWM B signal 110 could similarly be shifted early (to the left) by T/4 in the first frame and late (to the right) by T/4 in the second frame (i.e., the "BLR" case). Additionally, the PWM B signal 110 can similarly be shifted late (to the right) by T/4 in the first frame and early (to the left) by T/4 in the second frame (i.e., the "BRL" case). Basic Fourier Transform analysis shows that for the DLR and DRL cases applied repetitively to both the D and the B pulse, the frequency component at the frame rate of 1/T is suppressed, without changing the differential carrier frequency and without substantially impacting the differential signal component. In another particular example in which the DLR and DRL cases are applied randomly, the carrier power of the PWM signal is spread in frequency and its peak common mode power is significantly reduced without substantially altering a differential mode characteristic of the PWM signal.

In another embodiment, the first and second timing control blocks 120 and 122 can be adapted to operate in a quarter-frame centered single sided modulation in which the leading edges (or trailing edges) of the PWM B and PWM D pulses fixed to the frame edge. In yet another embodiment the first and second timing control blocks 120 and 122 can be adapted to operate in a chop mode in which the B and D are inverted and cross connected.

In general, while a number of techniques are disclosed above for suppressing a carrier of a PWM signal, it should be understood that other techniques can also be used. Further, though the above-discussion has included examples related to BD style PWM, other styles of PWM modulation can also be adapted to suppress the carrier of the PWM signal.

In general, the system 100 includes the first and second timing control blocks 120 and 122, which are adapted to periodically or randomly apply a modification to the PWM B and PWM D signals 110 and 112 such as shift between zero, T/2, and ±T/4 relative to the frame center. In general, it is preferred if the net modification operations are balanced over a power measurement time period. Since the PWM BD pulse widths are modulated by a slowly varying audio signal, adjacent frames will in general have the most highly correlated pulse widths and hence will balance better than less correlated pulse widths. Therefore, one way to maintain (enhance) this balance is for two or more adjacent frames to be grouped into a "superframe" using the modulation sequence controller 114. As applied to a phase shift carrier suppression modification operation for example, a superframe could be early-late (left right (LR) shifts in adjacent frames) or late-early (right left (RL) shifts in adjacent frames). The modulation sequence controller 114 is adapted to selectively apply a modulation sequence or pattern (superframe format) to alter a PWM carrier power spectrum. In a particular example, the modulation sequence controller 114 can periodically or randomly apply a selected superframe format. Further, depending on a desired notch frequency at the output, the modulation sequence controller 114 may select a particular sequence or pattern (such as RRRR, LLLL, RLRL, LRLR, RRLRR, LLRLL, other patterns, or any combination thereof), a particular pattern length (such as 2 symbols, 3 symbols, 4 symbols, 5 symbols, other symbol pattern lengths, or any combination thereof), or any combination thereof. In a particular example, particular patterns may introduce a notch at a particular frequency, and the pattern length may impact spacing between adjacent notches.

In general, the modulation sequence controller 114 may be adapted to periodically modify the superframe format at a superframe rate or at a lower rate. Similarly, the modulation sequence controller 114 can be adapted to randomly modify the superframe rate or to modify at a sub-multiple of the frame rate. In general, random modification by the modulation sequence controller 114 has a benefit of spectrally spreading, or whitening the common mode sidebands and their harmonics, essentially converting the strong spectral sideband tones into shaped noise. This property is helpful for reducing broadband electromagnetic interference (EMI) and achieving emission compliance, without impacting in-band signal characteristics. Additionally, the PWM carrier power spectrum created by the random shifting can be further colored by means known in the art (such as Sigma-Delta modulation) or with FIR filtering, to suppress carrier power in selected frequency areas, such as in the Amplitude Modulated (AM) or Frequency Modulated (FM) radio frequency bands.

In a particular embodiment, the first and second timing control blocks 120 and 122 are adapted to modulate the PWM signal to reduce a common mode carrier power without changing a carrier frequency of the PWM signal. Further, the modulation sequence controller 114 is adapted to selectively apply a selected superframe pattern to the modulated PWM signal to produce a PWM superframe output signal (PWM SFO) at an input of the first and second gate drivers 130 and 132 to reduce peak carrier power at particular frequencies of the output signals (Out B and Out D) at the low pass filter 150.

Figure 2:
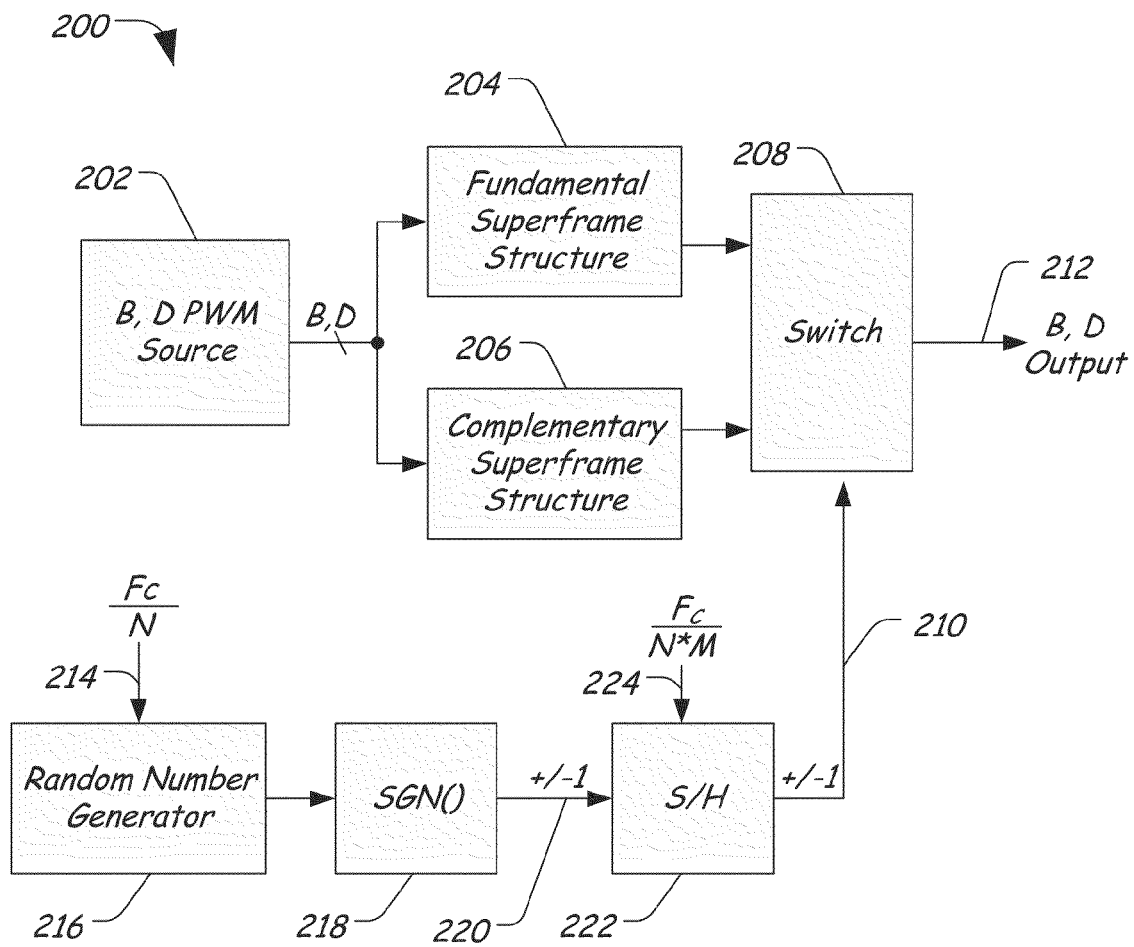
FIG. 2 is a block diagram of a second particular illustrative embodiment of a system to alter a PWM carrier power spectrum.

FIG. 2 is a block diagram of a second particular illustrative embodiment of a system 200 to alter a PWM carrier power spectrum. The system 200 includes a B and D pulse with modulated (PWM) source 202 that provides a PWM B and PWM D signal to a fundamental superframe structure 204 and to a complementary superframe structure 206, respectively. In this example, the fundamental superframe structure 204 and the complementary superframe structure 206 can be configured to apply a particular superframe pattern and its complement, respectively, to the PWM signals. The system 200 further includes a switch 208 to receive outputs of the fundamental superframe structure 204 and to the complementary superframe structure 206 and to selectively output at least one of the "superframed" or "complementary superframed" outputs as a BD modulated output signal at the output 212, which may be provided to gate drivers, such as the first and second gate drivers 130 and 132 illustrated in FIG. 1.

The system 200 includes a random number generator 216 that receives data related to carrier frequency ($F_C$) 214 and a superframe length (N) and outputs a random number. In a particular embodiment, the random number generator 216 can be any zero mean source number generator, preferably with a white spectrum. In another particular embodiment, the random number generator 216 can include a pseudo-random binary sequence generator. In yet another embodiment, the random number generator 216 can be a zero mean source with a colored spectrum. The random number output is provided to a sign generator (SGN( )) 218, which produces a binary output signal that varies between plus or minus one (±1). The signal from the sign generator 218 is provided to a superframe sample and hold logic (S/H) 222 that uses the carrier frequency ($F_C$), the superframe length (N), and a multiplier (M) as an input 224 to can cause a pattern to repeat at a selectable rate M and produce a superframe switching pattern 210 to control the switch 208. In a particular example, the multiplier M can be used to adjust the sample and hold rate to be a multiple or sub-multiple of the carrier frequency ($F_c$). In a particular example, lowering a sample rate can place notches closer together in frequency within the modulated PWM output. Conversely, increasing the sample rate can space notches further apart in frequency. Further, by adjusting the length and makeup (configuration) of a particular superframe pattern, notches can be placed at particular frequencies and the spacing of notches can be controlled to reduce a peak carrier power in the modulated PWM output signal.

In general, the sample and hold logic 222 can periodically or randomly cause a superframe pattern to repeat at the superframe rate or at a lower rate. Similarly, random switching can be at the superframe rate or at a sub-multiple of the frame rate. Additionally, the spectrum of the random switching can be colored by means know in the art (such as Sigma-Delta modulation), to suppress random noise components in selected frequency areas, such as in the audio band.

In a particular embodiment, a simple and effective randomization process randomly selects the "LR" or "RL" superframe, at the superframe rate. The effect of this random selection of the superframe places a frequency notch at the carrier frequency in the common mode. In a particular example, the notch is placed at 768 kHz.

Figure 3:
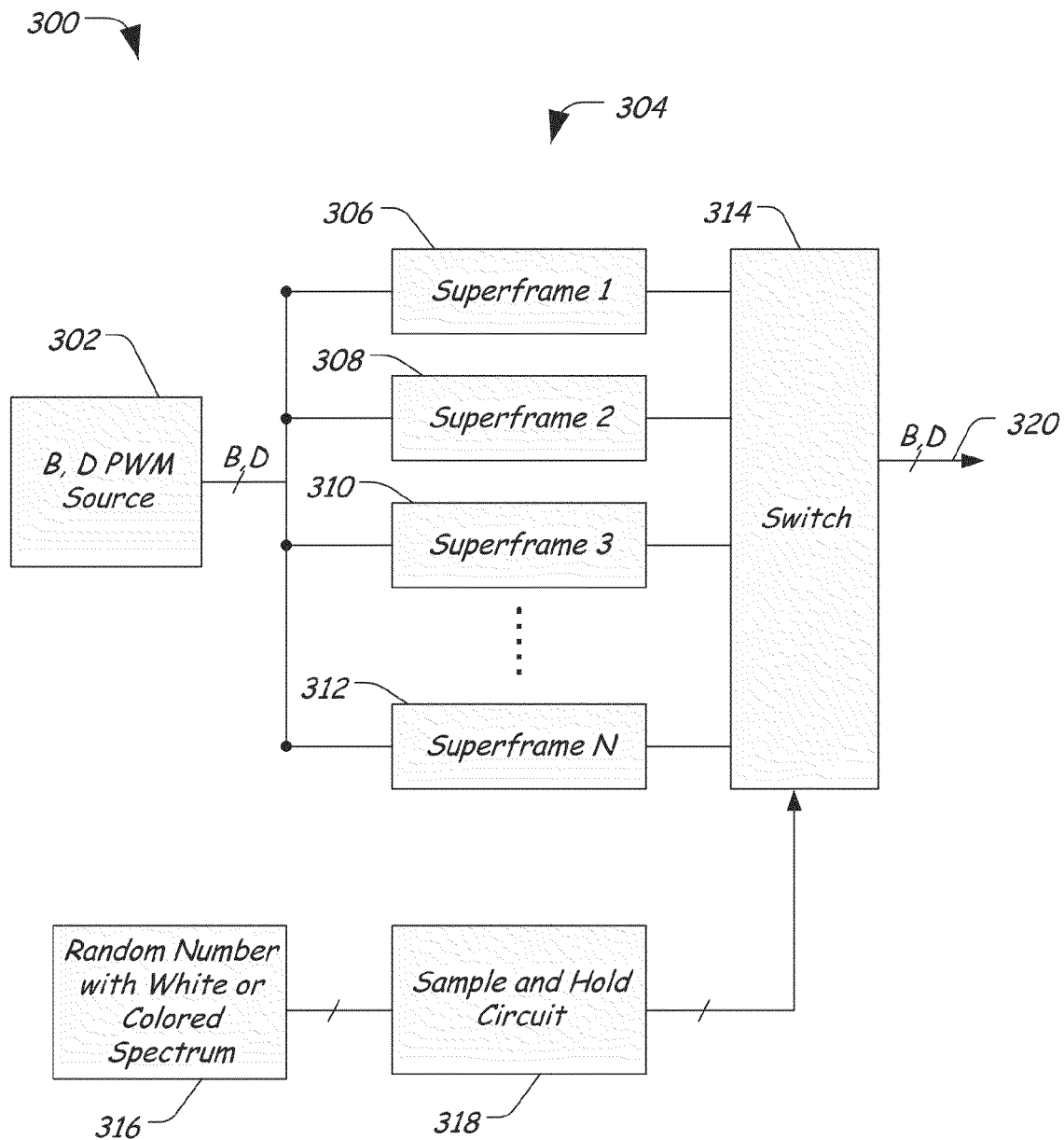
FIG. 3 is a block diagram of a third particular illustrative embodiment of a system to alter a PWM carrier power spectrum.

FIG. 3 is a block diagram of a third particular illustrative embodiment of a system 300 to alter a PWM carrier power spectrum. The system 300 includes a B,D pulse-width modulator 302 provides a B,D PWM signal to a plurality of superframes modules 304, including a first superframe module 306, a second superframe module 308, a third superframe module 310, and an n-th superframe module 312. In general, the plurality of superframe modules 304 can include any number of superframe modules. Each of the first, second, third, and n-th superframe modules 306, 308, 310, and 312 may represent different superframe patterns having different pattern lengths, different pattern sequences, or any combination thereof. Each of the first, second, third, and n-th superframe modules 306, 308, 310, and 312 provides an output to a switch 314. The system 300 further includes a random number generator 316, which provides two random select bits with a white or colored spectrum to a sample and hold module 318. The sample and hold module 318 is adapted to selectively provide a control sequence related to the two random select bits to the switch to selectively provide a modulated B,D PWM output signal at an output 320 that is modulated using the control sequence.

In a particular example, the first, second, third, and n-th superframe modules 306, 308, 310, and 312 are adapted to shift or chop the B,D PWM signal according to a predetermined superframe pattern (such as, for example, a shift left, shift right (LR) pattern). The random number generator 316 provides a random bit sequence to the sample and hold module 318, which uses the random bit sequence to produce a control sequence for selectively controlling the switch 314 to provide a modulated PWM output signal to the output 320, where the modulated PWM output signal has notches at controlled frequencies. In a particular example, the modulated PWM output signal includes a modulated PWM B output signal and a modulated PWM D output signal at the output 320.

Figure 4:
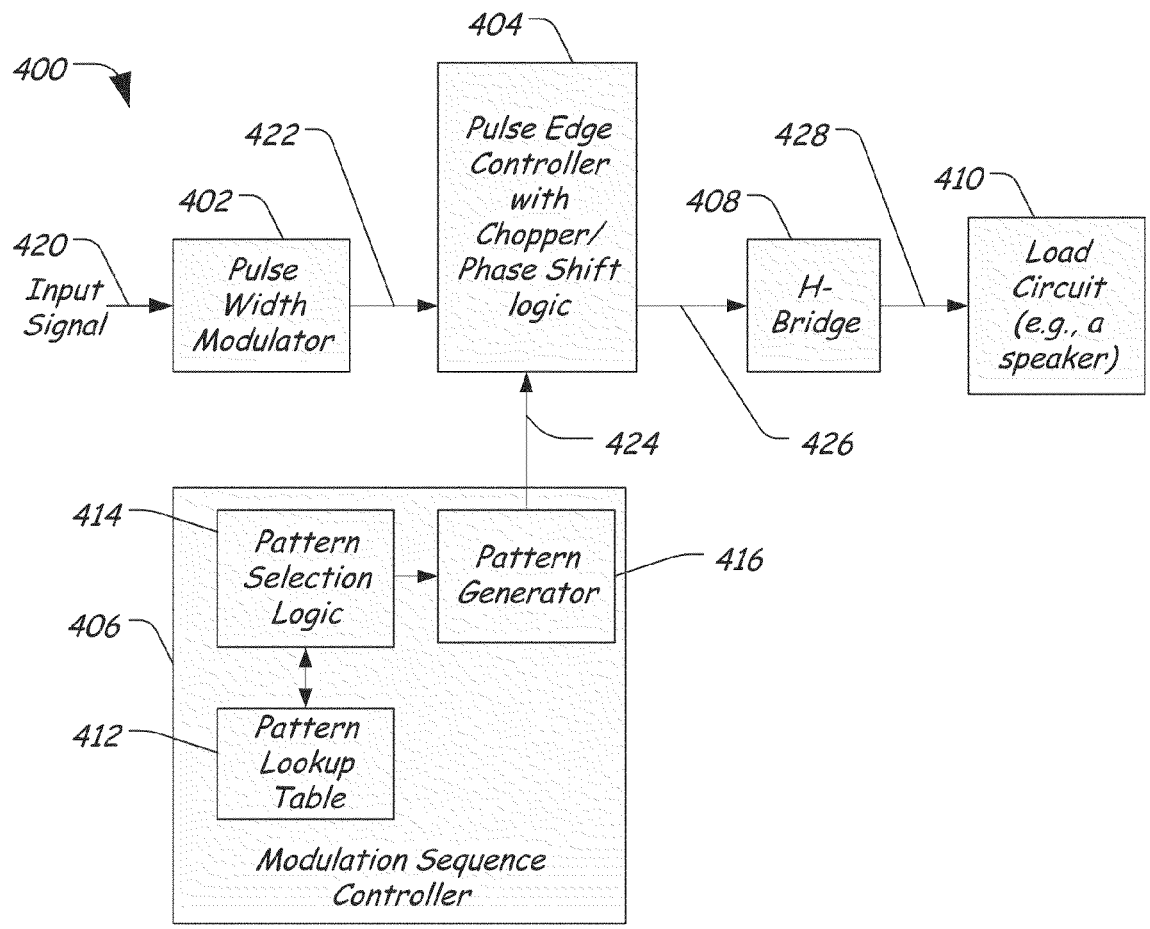
FIG. 4 is a block diagram of a fourth particular illustrative embodiment of a system to alter a PWM carrier power spectrum.

FIG. 4 is a block diagram of a third particular illustrative embodiment of a system 400 to alter a PWM carrier power spectrum. The system 400 includes a pulse-width modulator 402 that receives an input signal 420 and provides a pulse-width modulated (PWM) signal 422 to a pulse edge controller with chopper/phase shift logic 404. In a particular embodiment, the PWM signal 422 may include positive and negative PWM signals (i.e., differential PWM signals). The pulse edge controller with chopper/phase shift logic 404 is adapted to operate in one or more PWM modification operating modes, such as a half frame-centered symmetrical pulse shifting, quarter frame-centered symmetrical pulse shifting, quarter frame-centered asymmetrical pulse shifting with no wrap around, quarter frame-centered symmetrical pulse shifting with wrap around, or chopping, to produce a modulated PWM signal with suppressed carrier power and associated harmonics. The pulse edge controller with chopper/phase shift logic 404 is adapted to receive a control signal 424 from a modulation sequence controller 406 and to group adjacent pulse width modulated frames according to a superframe pattern based on the control signal 424. The pulse edge controller with chopper/phase shift logic 404 provides a modulated and grouped output 426 to an H-bridge circuit 408, which switches to provide an output 428 to a load circuit 410, such as a speaker.

The modulation sequence controller 406 includes pattern selection logic 414 that is coupled to a pattern lookup table 412 and includes a pattern generator 416 to provide the control signal to the pulse edge controller with chopper/phase shift logic 404. In a particular embodiment, the pattern lookup table 412 may include a plurality of binary patterns that can be derived from testing, simulation or analysis to produce notches at desired output frequencies and at desired notch spacing to reduce a PWM carrier power at particular frequencies. In a particular embodiment, the modulation sequence controller 406 uses the pattern selection logic 414 to select a particular pattern from the pattern lookup table 412 based on a desired frequency notch or notches. The selected pattern can be provided to the pattern generator 416, which uses the pattern to generate a control signal 424 for use by the pulse edge controller with chopper/phase shift logic 404 to reduce a PWM carrier power spectrum at particular frequencies.

Figure 5:
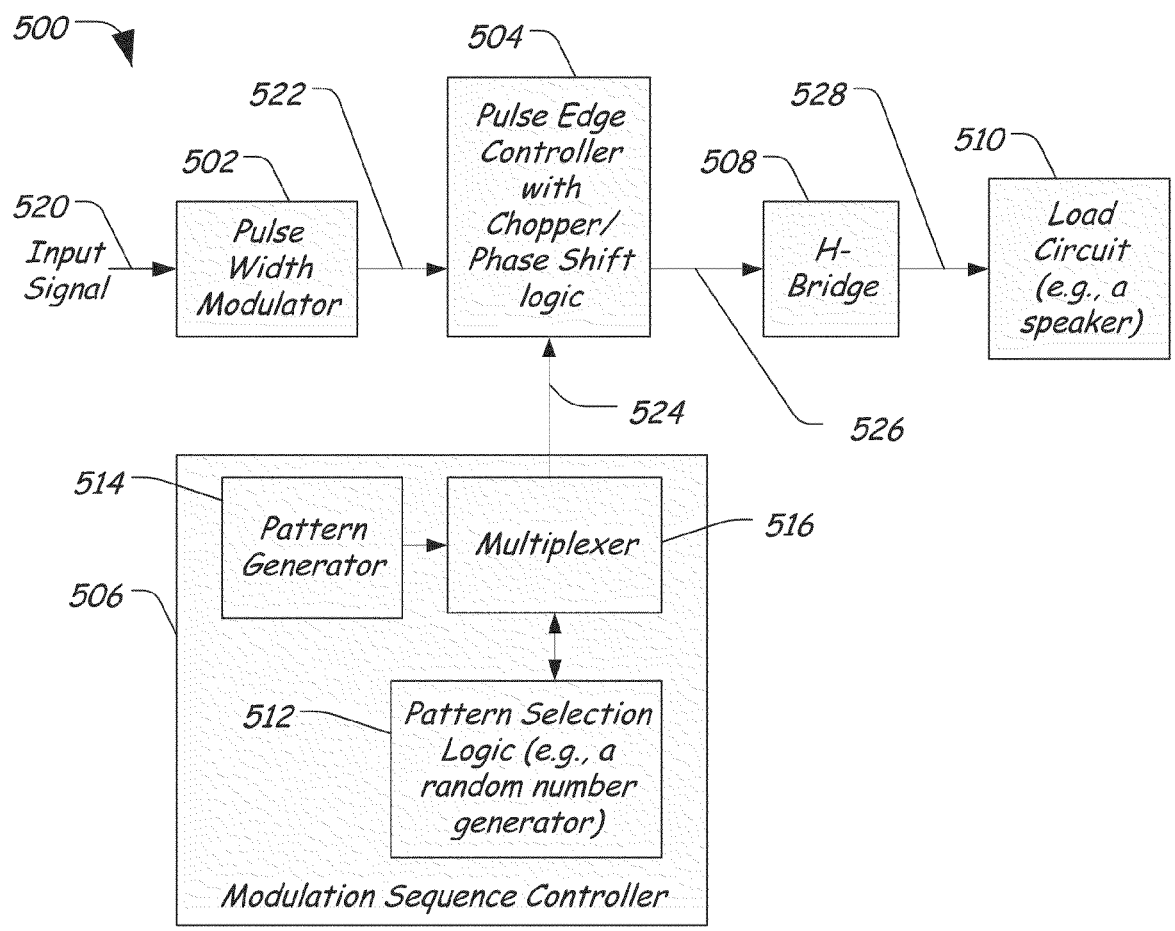
FIG. 5 is a block diagram of a fifth particular illustrative embodiment of a system to alter a PWM carrier power spectrum.

FIG. 5 is a block diagram of a fourth particular illustrative embodiment of a system 500 to alter a PWM carrier power spectrum. The system 500 includes a pulse-width modulator 502 that receives an input signal 520 and provides a pulse-width modulated (PWM) signal 522 to a pulse edge controller with chopper/phase shift logic 504. In a particular embodiment, the PWM signal 522 may include positive and negative PWM signals (i.e., differential PWM signals). The pulse edge controller with chopper/phase shift logic 504 is adapted to operate in one or more PWM modification operating modes, such as a half frame-centered symmetrical pulse shifting, quarter frame-centered symmetrical pulse shifting, quarter frame-centered asymmetrical pulse shifting with no wrap around, quarter frame-centered symmetrical pulse shifting with wrap around, or chopping, to produce a modulated PWM signal with suppressed carrier power and associated harmonics. The pulse edge controller with chopper/phase shift logic 504 is adapted to receive a control signal 524 from a modulation sequence controller 506 and to group adjacent pulse width modulated frames according to a superframe pattern based on the control signal 524. The pulse edge controller with chopper/phase shift logic 504 provides a modulated and grouped output 526 to an H-bridge circuit 508, which switches to provide an output 528 to a load circuit 510, such as a speaker.

The modulation sequence controller 506 includes a pattern generator 514 that produces one or more binary patterns. The modulation sequence controller 506 further includes pattern selection logic 512 (such as a random number generator) to produce an output. The modulation sequence controller 506 further includes a multiplexer 516 to receive one or more patterns from the pattern generator 514 and to selectively provide at least one of the one or more patterns to the pulse edge controller with chopper/phase shift logic 504 as a control signal 524 for use as a superframe to group the modulated PWM signal frames. In a particular example, the pattern selection logic 512 provides a random number to the multiplexer 516 to select between the one or more binary patterns.

Figure 6:
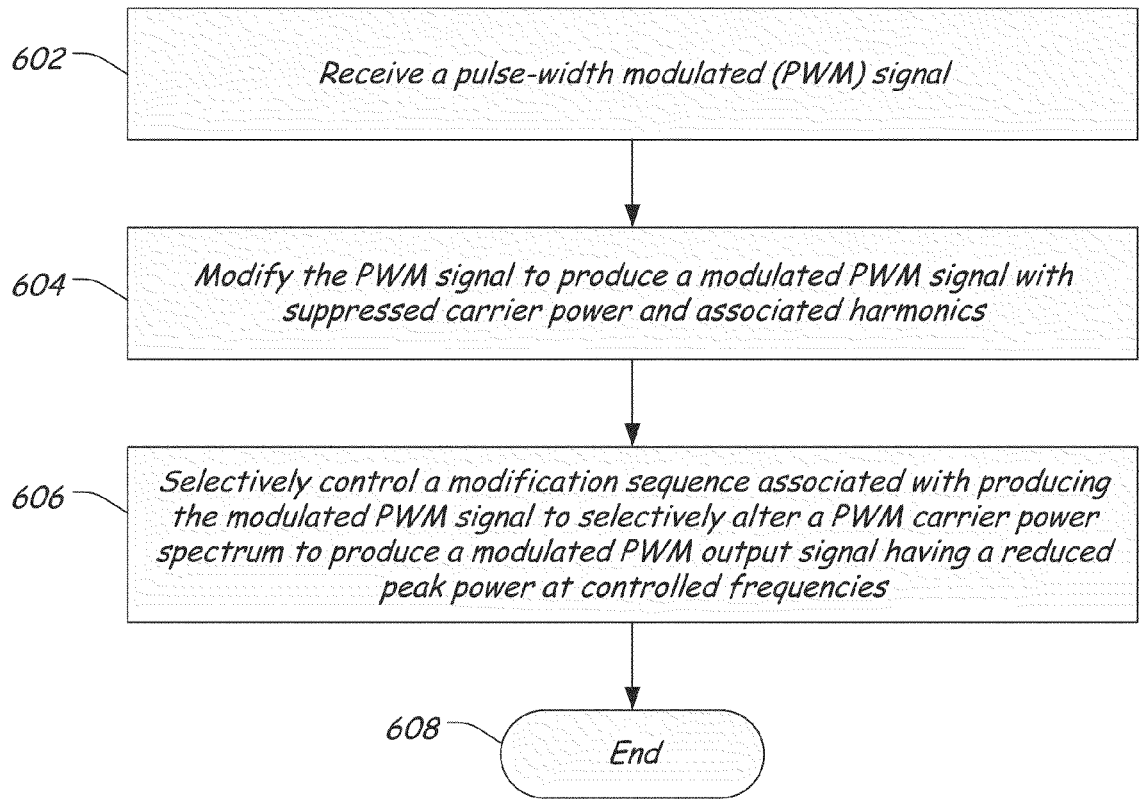
FIG. 6 is a flow diagram of a particular illustrative embodiment of a method of altering a PWM carrier power spectrum.

FIG. 6 is a flow diagram of a particular illustrative embodiment of a method of providing carrier suppression. At 602, a pulse-width modulated (PWM) signal is received. Advancing to 604, the PWM signal is modulated to produce a modulated PWM signal with suppressed carrier power and associated harmonics. Moving to 606, a modification sequence associated with producing the modulated PWM signal is selectively controlled to selectively alter a PWM carrier power spectrum to produce a modulated PWM output signal having a reduced peak power at controlled frequencies. In a particular embodiment, selectively controlling the modification sequence includes controlling a sequencing of a phase-shifting or chopping operation to selectively place notches at particular frequencies in a power spectrum of the modulated PWM output signal. In another particular embodiment, selectively controlling the modification sequence includes controlling a sequencing of a phase-shifting or chopping operation to selectively place notches at particular frequencies in the modulated PWM output signal. In still another particular embodiment, selectively controlling the modification sequence includes controlling the sequencing of the phase-shifting or chopping operation to reduce electromagnetic interference (EMI) and radio frequency (RF) interference at particular frequencies. The method terminates at 608.

In a particular embodiment, the method further includes selectively controlling the modification sequence to suppress a carrier power and its associated harmonics and to spread energy associated with the carrier to other frequency bands in the modulated PWM output signal. In a particular example, selectively controlling the modification sequence includes randomly adjusting the modification sequence to suppress a peak power of the PWM carrier power spectrum within the modulated PWM output signal.

In a particular embodiment, by selectively applying the superframe pattern, electromagnetic interference (EMI) and AM radio interference are reduced at controlled frequencies. In a particular embodiment, the at least one superframe pattern is designed to selectively place notches at controlled frequencies in the modulated PWM output signal. In another particular example, the at least one superframe pattern includes a first superframe pattern and a complementary superframe pattern that are selectively applied to the modulated PWM signal to produce the modulated PWM output signal.

In a particular embodiment, the method includes switching between superframe patterns to suppress the PWM carrier power and to spread energy associated with the carrier to other frequency bands in the modulated PWM output signal. In another particular embodiment, the superframe patterns are switched randomly to suppress a peak power of the PWM carrier power spectrum within the modulated PWM output signal. In still another particular embodiment, particular pattern lengths associated with the at least one superframe pattern are selected to selectively place notches at controlled frequencies in the modulated PWM output signal.

Figure 7:
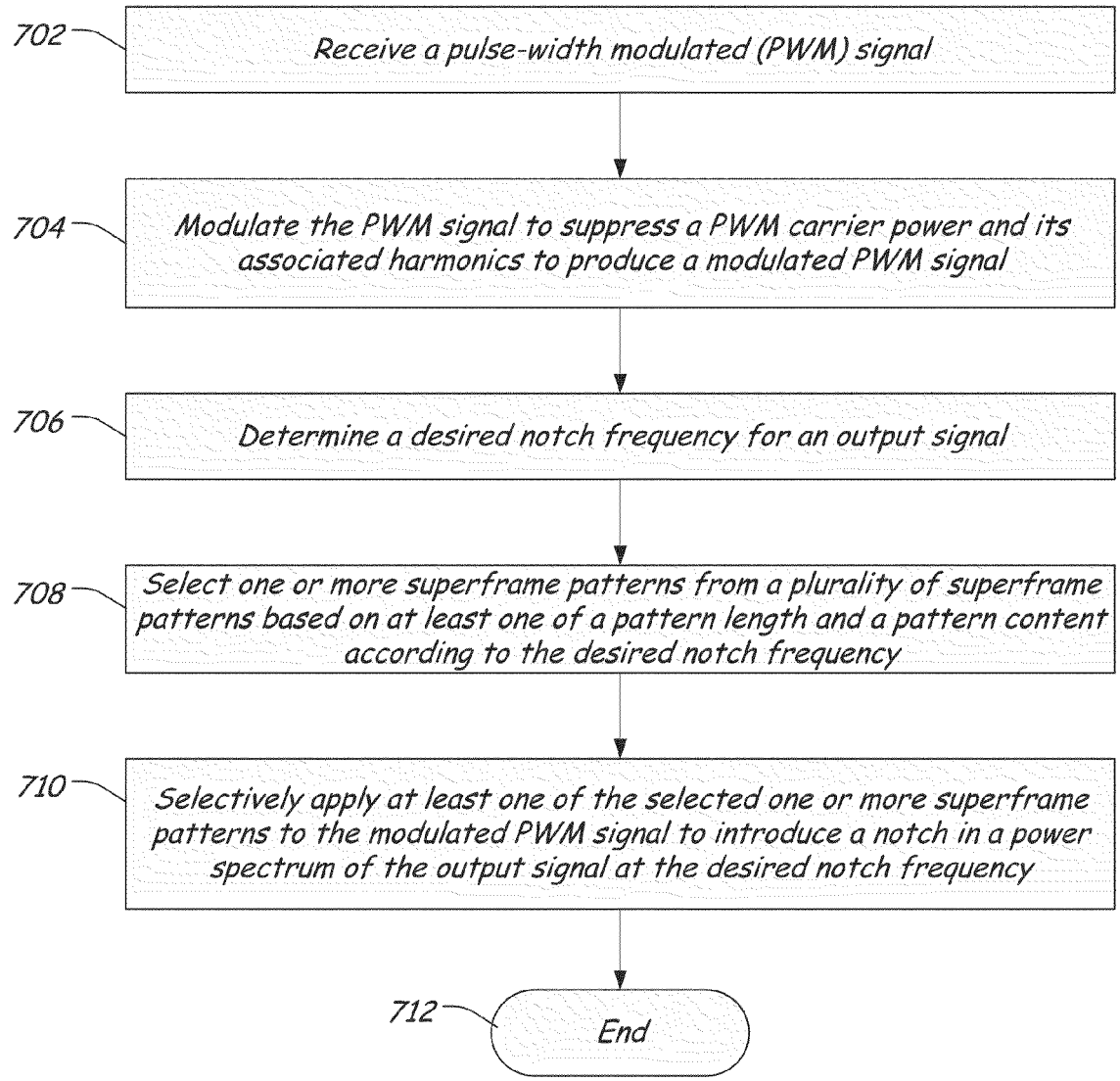
FIG. 7 is a flow diagram of a second particular illustrative embodiment of a method of altering a PWM carrier power spectrum.

FIG. 7 is a flow diagram of a second particular illustrative embodiment of a method of providing PWM carrier suppression. At 702, a pulse-width modulated (PWM) signal is received. Advancing to 704, the PWM signal is modulated to suppress a PWM carrier power and its associated harmonics to produce a modulated PWM signal. Moving to 706, a desired notch frequency is determined for an output signal. Continuing to 708, one or more superframe patterns are selected from a plurality of superframe patterns based on at least one of a pattern length and a pattern content according to the desired notch frequency. Proceeding to 710, at least one of the selected one or more superframe patterns is selectively applied to the modulated PWM signal to introduce a notch in a PWM carrier power spectrum of the output signal at the desired notch frequency.

Figure 8:
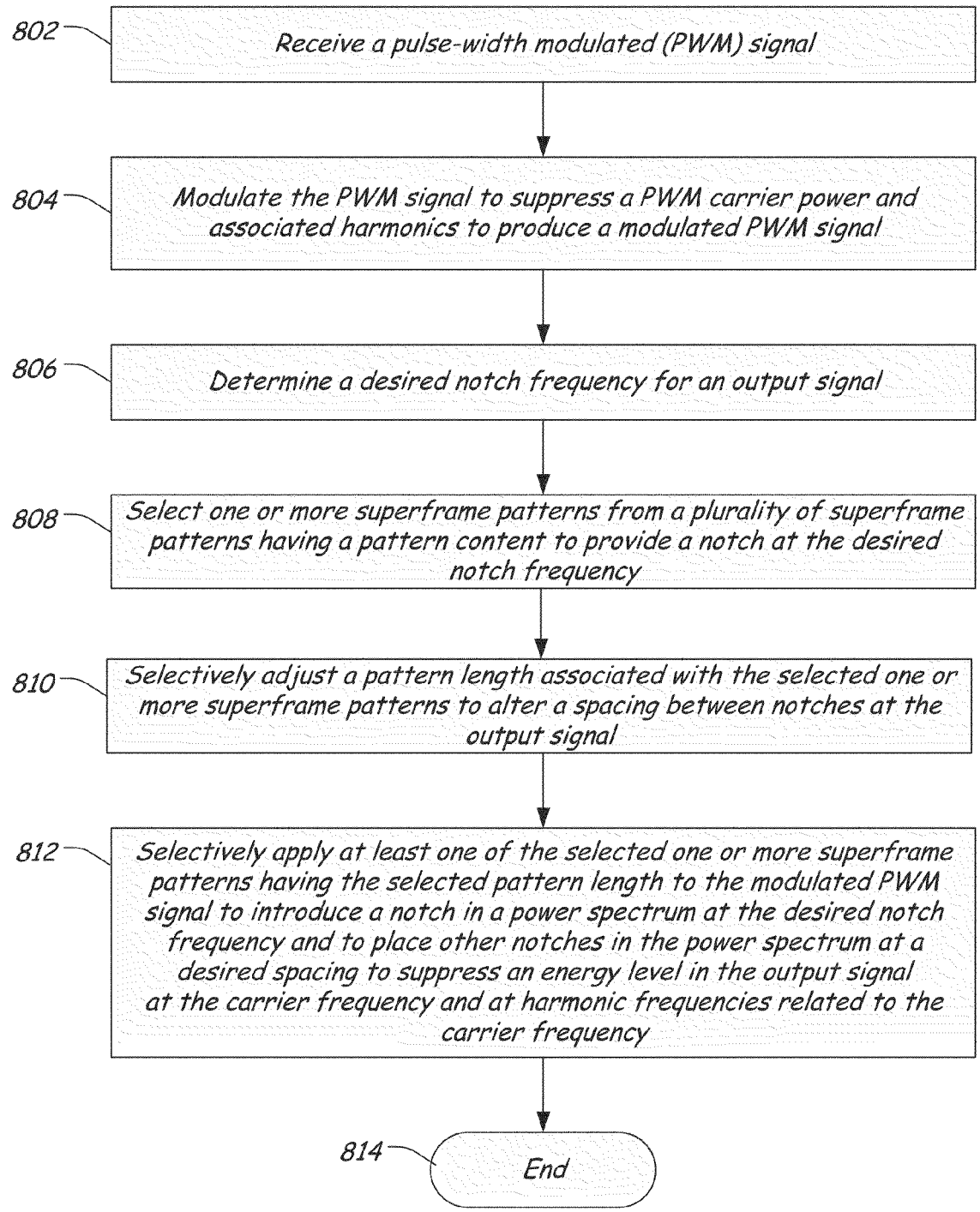
FIG. 8 is a flow diagram of a third particular illustrative embodiment of a method of altering a PWM carrier power spectrum.

FIG. 8 is a flow diagram of a third particular illustrative embodiment of a method of providing PWM carrier power suppression. At 802, a pulse-width modulated (PWM) signal is received. Continuing to 804, the PWM signal is modulated to suppress a PWM carrier power and associated harmonics to produce a modulated PWM signal. Moving to 806, a desired notch frequency is determined for an output signal. Advancing to 808, one or more superframe patterns are selected from a plurality of superframe patterns having a pattern content to provide a notch at the desired notch frequency. Proceeding to

810, a pattern length associated with the selected one or more superframe patterns are selectively adjusted to alter a spacing between notches at the output signal. Continuing to 812, at least one of the selected one or more superframe patterns having the selected pattern length is selectively applied to the modulated PWM signal to introduce a notch in a power spectrum at the desired notch frequency and to place other notches in the power spectrum at a desired spacing to suppress an energy level in the output signal at the carrier frequency and at harmonic frequencies related to the carrier frequency. The method terminates at 814.

Figure 9:
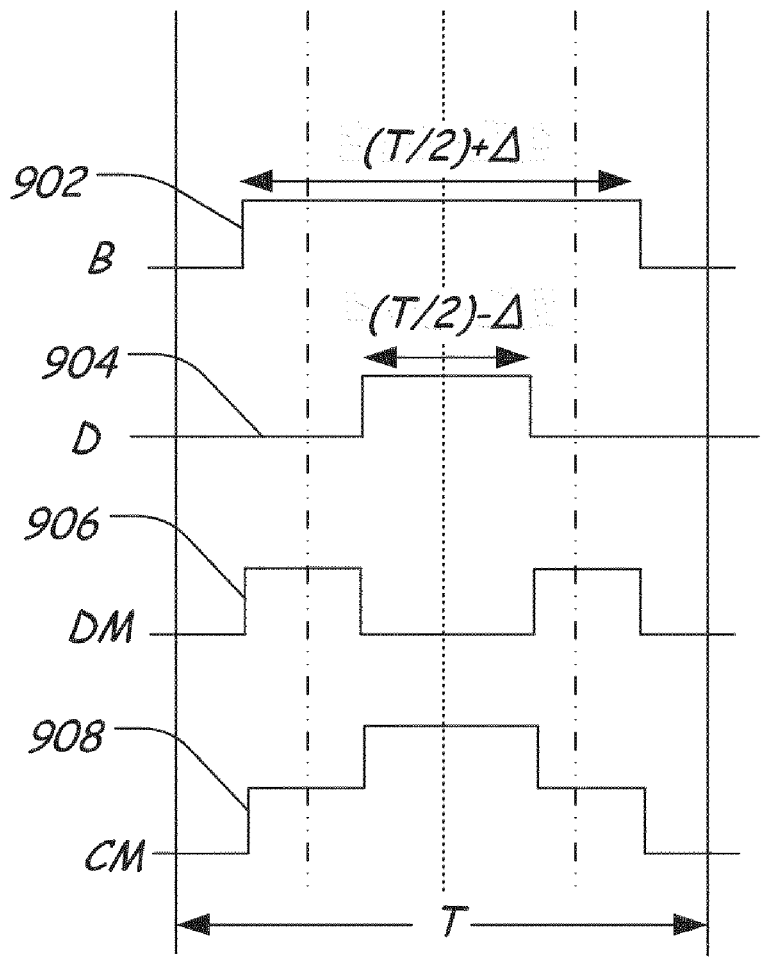
FIG. 9 is a graph of a particular representative embodiment of a conventional BD modulated signal where pulse widths of two pulse waves are varied, which pulse waves are aligned in phase and often centered within a pulse width modulated (PWM) frame.

FIG. 9 is a graph 900 of a particular representative embodiment of a conventional BD style PWM signal where pulse widths of two pulse waves are varied, which pulse waves are aligned in phase and often centered within a pulse width modulated (PWM) frame. In general, BD style PWM is used with many class D amplifiers at an output that drives an H-bridge, for example. The PWM frame has a time (T) and the pulse widths of the two signals (B and D) 902 and 904 are nominally centered within the PWM frame (at approximately T/2). For positive input signals, the pulse width of the signal that drives the high side of the bridged output (the "B" signal 902) is increased by delta (Δ) while the pulse width of the signal that drives the low side of the bridged output (the "D" signal 904) is decreased by delta (Δ).

In general, the result is a differential signal 906 across the load (i.e. a filter in cascade with a speaker) consisting of two positive pulses centered at +/−T/4, where T is the width of the PWM frame and where the reference time position T=0 represents the center of the frame. In general, the carrier frequency of the differential signal 906 is at twice the PWM frame rate.

Conversely, for negative input signals, the negative pulse width of the D signal 904 increases while the positive pulse width of the B signal 902 decreases resulting two similar but negative pulses. Differentially, this is an efficient arrangement since there is no wasted differential energy. However, a strong common mode component 908 is created at the PWM frame rate.

Figure 10:
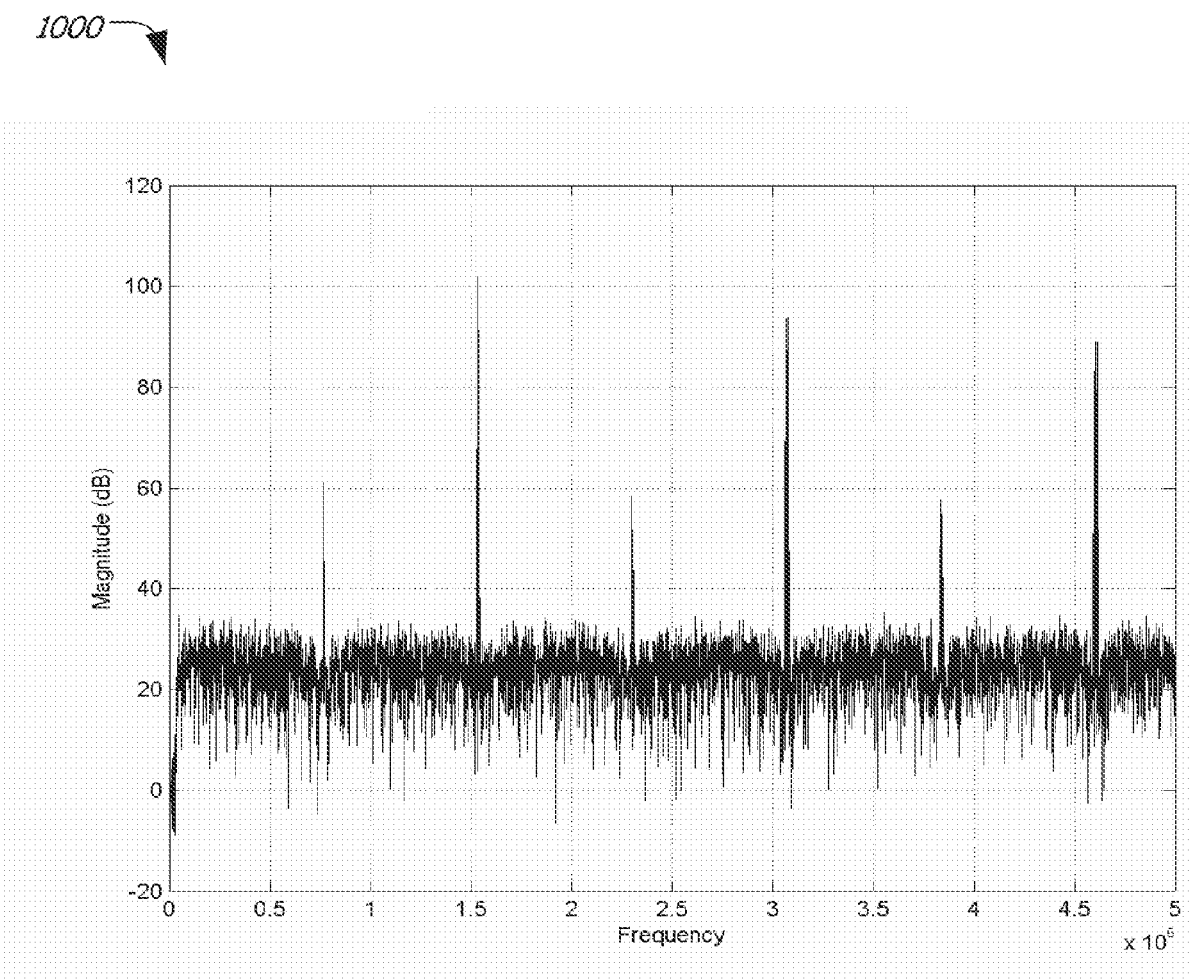
FIG. 10 is a graph of a differential mode (DM) power spectrum of an output signal using the BD modulated signal illustrated in FIG. 8 and using a 768 kHz frame rate.

FIG. 10 is a graph of a differential mode (DM) power spectrum 1000 of an output signal using the BD style PWM signal illustrated in FIG. 9 and using a 768 kHz frame rate. In particular, the carrier frequency of the differential mode signal 906 (illustrated in FIG. 9) is at twice the frame rate of 768 kHz. In general, it should be noted that there are low-level components (−40 dB) at the carrier frequency. Such components occur when the input or the delta (Δ) is equal to zero.

Figure 11:
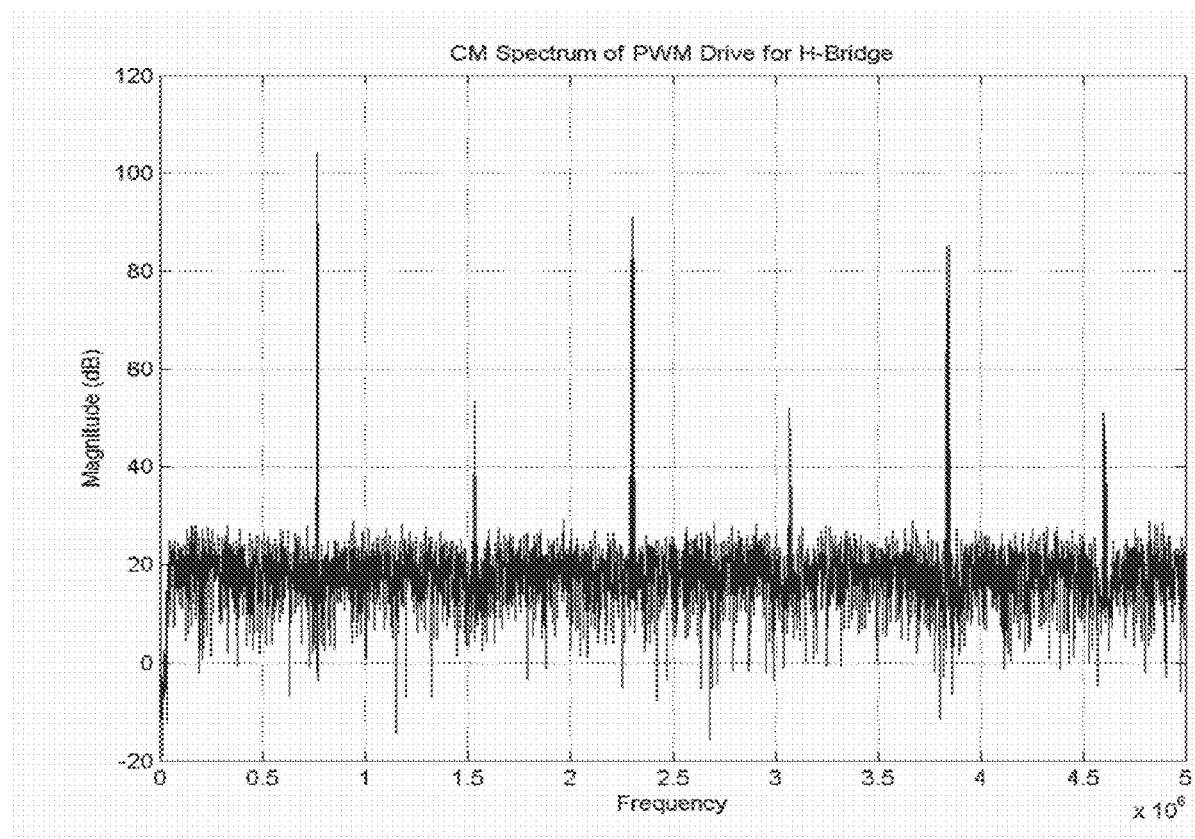
FIG. 11 is a graph of a common mode (CM) power spectrum of an output signal using the BD modulated signal illustrated in FIG. 8 and using a 768 kHz frame rate.

FIG. 11 is a graph of a common mode (CM) power spectrum 1100 of an output signal using the BD style PWM signal illustrated in FIG. 9 and using a 768 kHz frame rate. Unfortunately, centering of the B and D signals within the pulse-width modulated (PWM) frame (such as the B and D signals 902 and 904 illustrated in FIG. 9) introduces a strong common mode component that is indicated by the peak common mode power levels at the carrier frequency and at harmonic frequencies of the carrier frequency. Such common mode power levels at the carrier frequency and associated harmonics can generate electromagnetic interference (EMI) and AM radio interference in nearby receiver circuitry. The common mode carrier frequency is centered inconveniently at the frame rate. Given that practical switching frequencies for audio applications range from 200 kHz to 1000 kHz and the AM band ranges from 520 kHz to 1710 kHz, there is a problem with radiated interference of the common mode carrier and its harmonics jamming reception of an AM radio in close proximity or in the same system. Therefore, it is desirable to suppress the common mode carrier of a class-BD double-sided symmetrical modulated signal without compromising differential mode performance.

Figure 12:
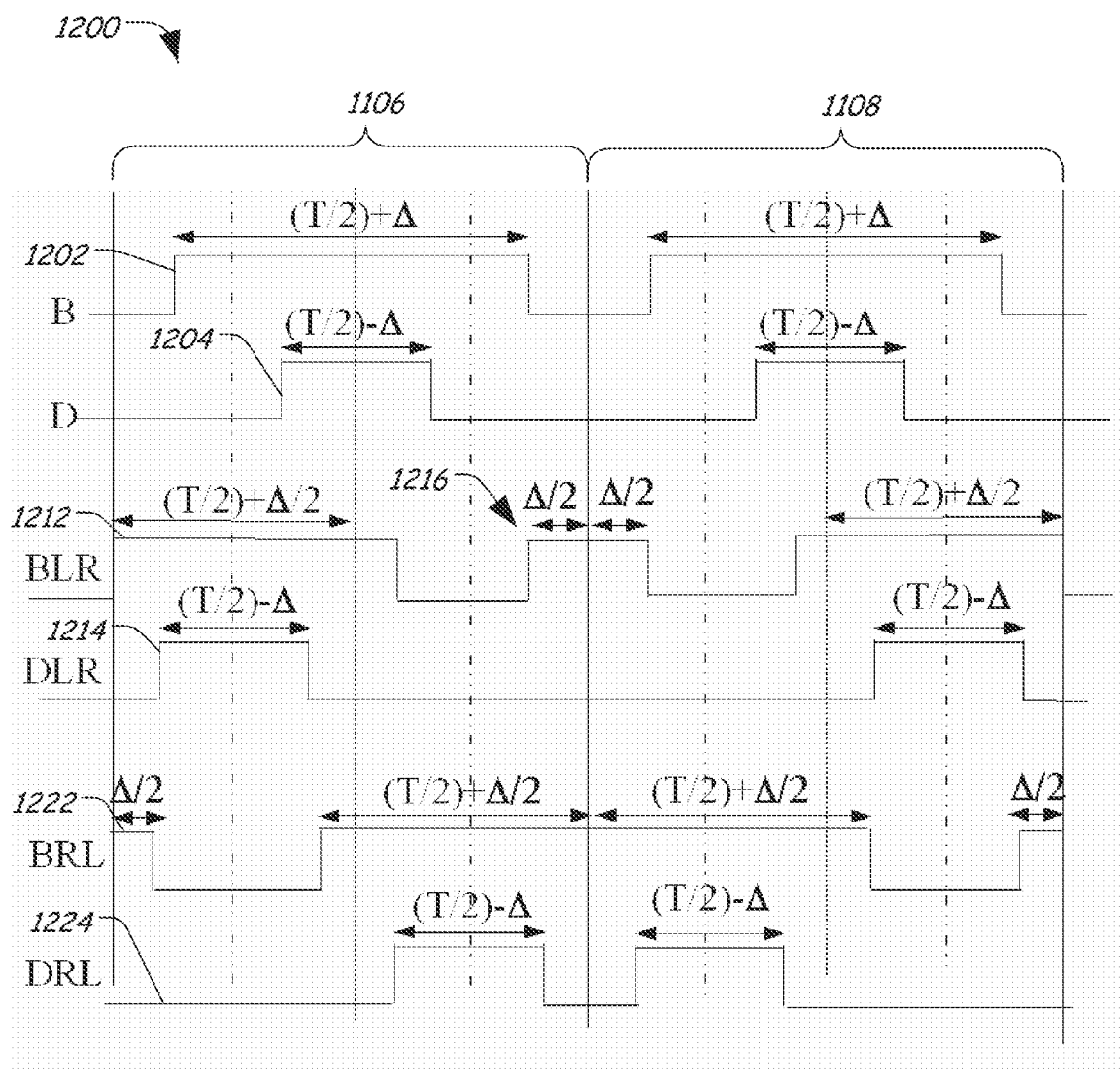
FIG. 12 is a graph of a particular illustrative embodiment a BD modulated signal with pulse wrap around to suppress a carrier at a desired frame rate.

FIG. 12 is a graph 1200 of a particular illustrative embodiment a BD style PWM signal using quarter frame-centered symmetrical pulse shifting with pulse wrap around to suppress a PWM carrier power. In this pulse shifting technique, an original pulse-width modulated (PWM) B pulse 1202 and PWM D pulse 1204 are shown as centered at T/2 within adjacent PWM frames 1206 and 1208. In a first example, the graph 1200 shows the PWM B pulse 1202 shifted are shifted by −T/4 or +T/4 with respect to a center of the frame. In particular, the graph 1200 includes versions of the PWM B and PWM D signals 1202 and 1204 that are shifted in adjacent frames 1206 and 1208 with wrap around. In a first example, the graph 1200 illustrates a left-right (LR) shift, as indicated by the PWM BLR and DLR signals 1212 and 1214, and a right-left (RL) shift, as indicated by the PWM BRL and DRL signals 1222 and 1224, respectively. In this example, the PWM B 1202 is wider than T/2, so shifting the PWM B 1202 by a quarter frame (−T/4) would cause a portion (Δ/2) of the shifted pulse 1212 to fall into the previous frame. To alleviate this issue, the portion (Δ/2) of the shifted pulse 1212 that would have fallen into the previous frame is wrapped to the opposite end of the current frame (as indicated at 1216). This "wrap around" technique preserves symmetry and ensures that the shifted PWM B signal 1212 (that is shifted left then right or right then left) has no Fourier component at the frame rate and the PWM D signal 1214 also has no signal component at the frame rate. Therefore, the common mode signal (PWM B+D)/2 has no Fourier component at the frame rate and neither does the differential signal, (PWM B−D).

In general, it should be understood that the particular example provided in FIG. 12 represents only one of a number of possible techniques that can be applied to the pulse-width modulated (PWM) signal to suppress a carrier power and its associated harmonics. Other techniques, such as a quarter-frame-centered shift without wrapping, a chopping technique, other modulation techniques, or any combination thereof can be used. The following examples are based on a pulse shift with wrap around technique. However, use of other carrier suppression techniques can provide similar results. For simplicity, only the pulse shift with wrap around example is explored.

Figure 13:
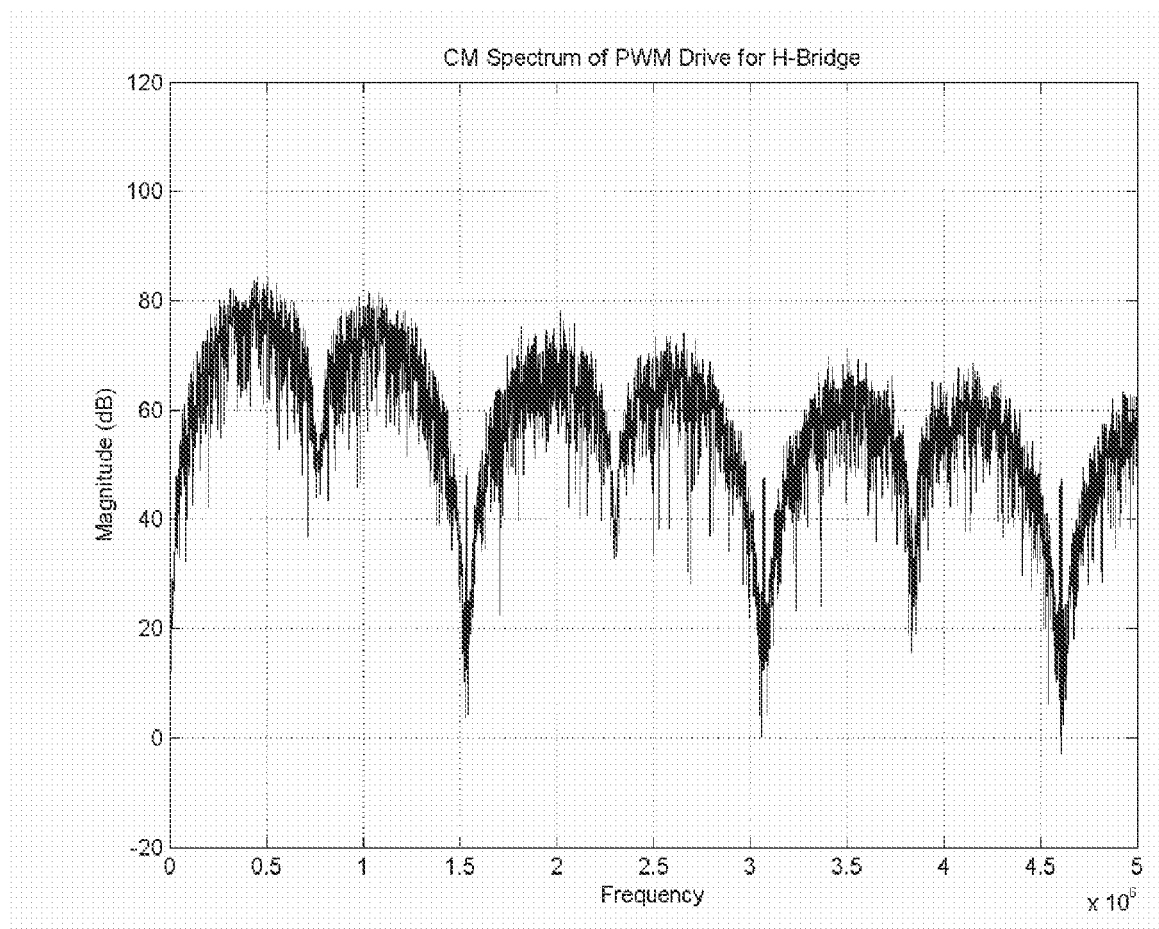
FIG. 13 is a graph of a particular illustrative embodiment of a common mode power spectrum of magnitude in decibels versus frequency for a pulse shift with wrap around modification operation sequenced by a random superframe selection at the superframe rate, where the frame rate is 768 kHz.

FIG. 13 is a graph 1300 of a particular illustrative embodiment of a common mode power spectrum of magnitude in decibels versus frequency for a pulse shift with wrap around modification operation sequenced by a random superframe selection at the superframe rate, where the frame rate is 768 kHz. In general, as compared to a conventional common mode carrier power level for BD style PWM illustrated in FIG. 11, the common-mode power spectrum graph in FIG. 13 demonstrates that the peak common mode carrier power is reduced by approximately 25 dB. Further, the common mode carrier at 768 kHz has been almost completely eliminated, and the power spectrum around at the carrier harmonic frequencies, such as 384 kHz and 1152 kHz has increased. This spectral shaping occurs because the superframe is now twice the frame size in duration or equivalently has a fundamental frequency of 384 kHz. By balancing the shift left and shift rights, the even harmonics are eliminated, but not the odd harmonics. If a superframe were used that provided periodic shifting of LRLRLR rather than random L, random R, distinct tones can occur at 384 kHz and 1152 kHz. The randomization has effectively spread these tones.

It should be understood that AM radio interference mitigation is also improved. By adjusting the length of particular superframe patterns and by changing the patterns, notches can be placed at desired frequencies to suppress the spectral shape at particular frequencies, or in particular frequency bands. In FIG. 13, the superframe was designed to be one frame in duration, and the selection of the superframe was randomly selected as L (−T/4 shift) or R (+T/4 shift). However, the design and length of the superframe can be chosen to minimize the spread carrier noise at selected frequencies. In very simple terms, longer superframe durations (in the time domain) reduce the spacing of the notches in the frequency domain.

In general, to selectively notch out certain frequency bands or stations (for AM radio interference mitigation), numerous superframes can be designed. TABLE 1 below shows some representative designs.

TABLE 1

Representative Superframe Designs to Place Notches at Controlled Frequencies

| Mitigation Band | Fundamental Superframe Design | Complementary Superframe Design |
| --- | --- | --- |
| A | L | R |
| B | LL | RR |
| C | LRLR | RLRL |

If the goal is to minimize spread energy in Band A, the BD modulator can be adapted to randomly use the "fundamental" superframe structure or the "complementary" superframe structure corresponding to row A. Additionally, for frequency bands B and C, the BD modulator can be adapted to randomly use alternately designed superframes. In general, the "complementary" superframes illustrated in TABLE 1 are designed to exactly balance the "fundamental" superframe so that the average phase modulation of the B-D pulses is zero. In general, the design of the superframe structure to minimize the spread energy in a particular frequency band can be performed analytically or through an exhaustive search and testing via simulation or experiment.

Figure 14:
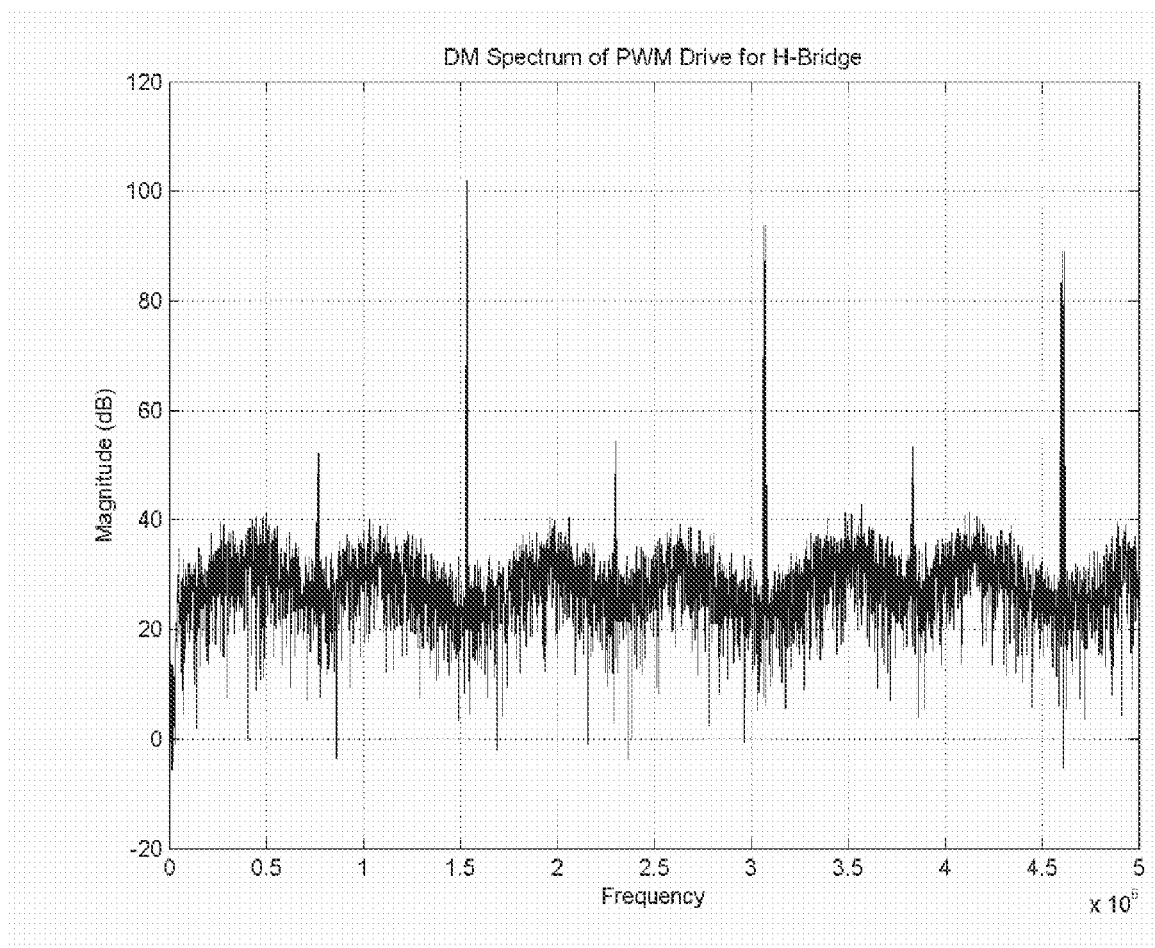
FIG. 14 is a graph of a particular illustrative embodiment of a differential mode power spectrum of magnitude in decibels versus frequency for a pulse shift with wrap around modification operation sequenced by a random superframe selection at the superframe rate, where the frame rate is 768 kHz.

FIG. 14 is a graph 1400 of a particular illustrative embodiment of a differential mode power spectrum of magnitude in decibels versus frequency for a pulse shift with wrap around modification operation sequenced by a random superframe selection at the superframe rate, where the frame rate is 768 kHz. In the differential mode, the power spectrum illustrates a slight reduction in peak power at the frame rate 768 kHz, and a spreading of the power around intermediate harmonics of the frame rate, such as at 384 kHz and 1152 kHz. However, the differential mode power spectrum shows only slight additive noise around the intermediate harmonics and very little change at the carrier frequency 768 kHz.

Figure 15:
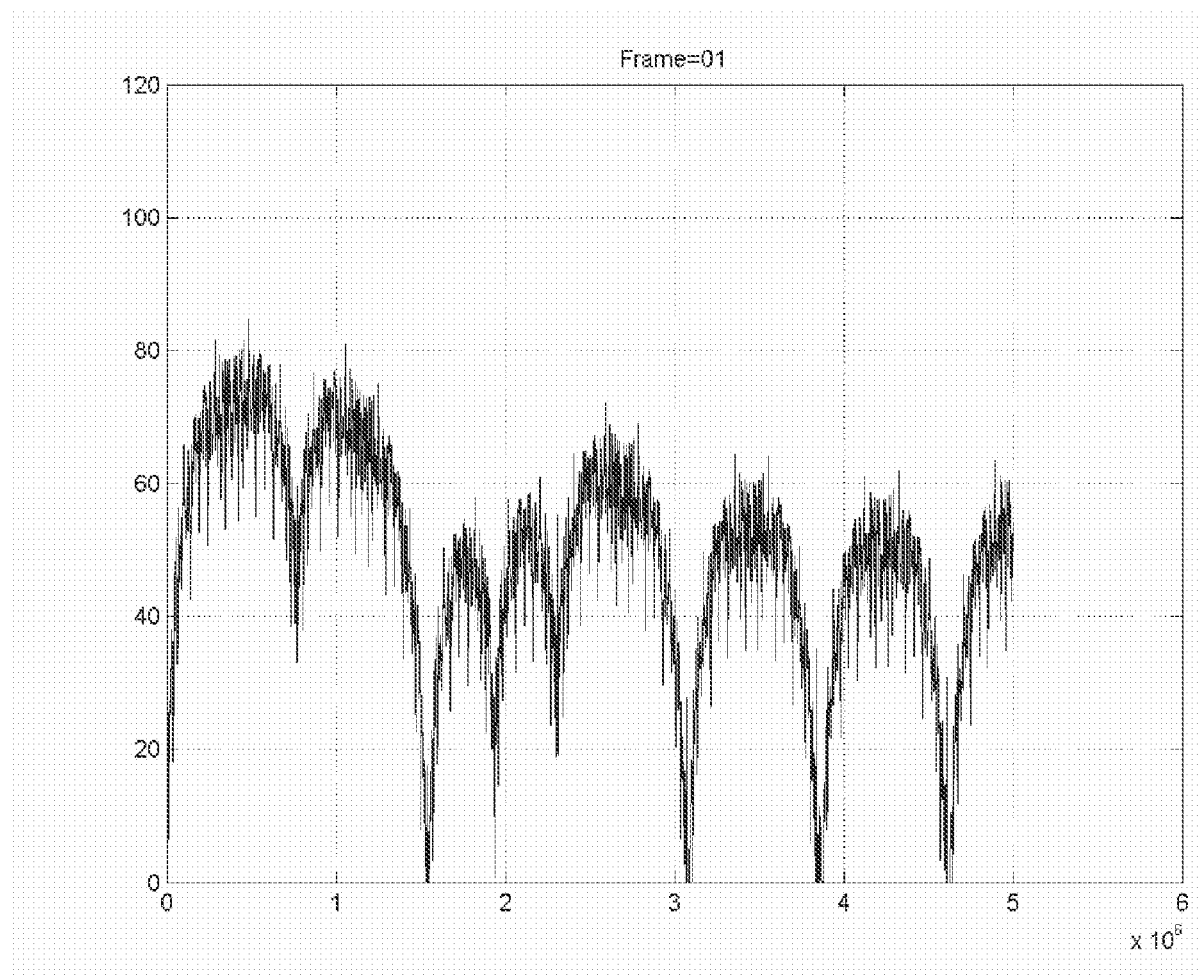
FIG. 15 is a graph of a particular illustrative embodiment of a common mode power spectrum of magnitude in decibels versus frequency for a pulse shift with wrap around modification operation sequenced by a fundamental (RL) superframe and a complementary (LR) superframe.

FIG. 15 is a graph 1500 of a particular illustrative embodiment of a common mode power spectrum of magnitude in decibels versus frequency for a pulse shift with wrap around modification operation sequenced by a fundamental (RL) superframe and complementary (LR) superframe. As shown, the common mode power spectrum illustrates a 25 dB reduction in peak power and notches that significantly reduce and in some cases eliminate the carrier at the carrier frequency and its harmonics. For example, the common mode harmonic of the carrier frequency 768 kHz is eliminated at 1536 kHz, according to the common mode power spectrum.

Figure 16:
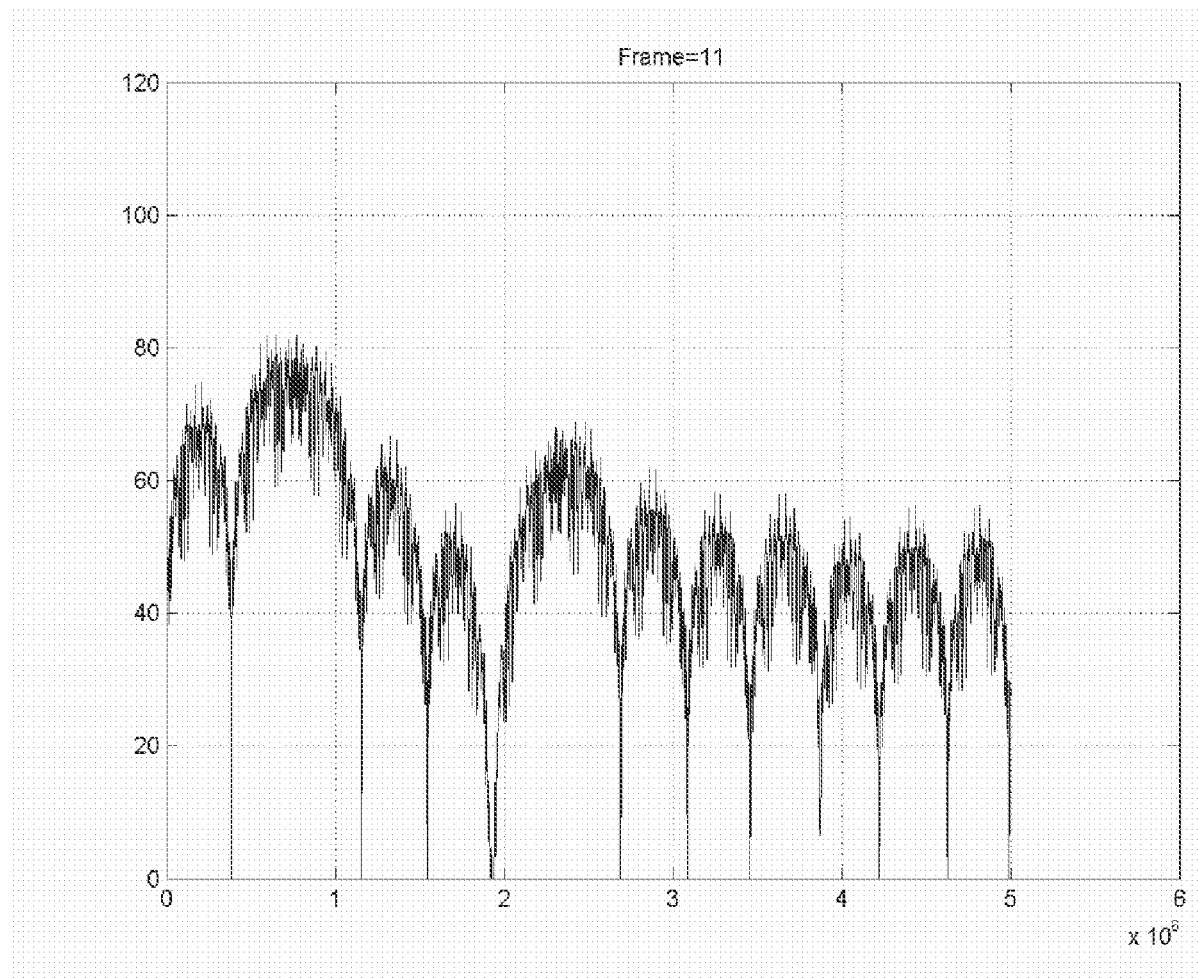
FIG. 16 is a graph of a particular illustrative embodiment of a common mode power spectrum of magnitude in decibels versus frequency for a pulse shift with wrap around modification operation sequenced by a fundamental (LL) superframe and a complementary (RR) superframe.

FIG. 16 is a graph 1600 of a particular illustrative embodiment of a common mode power spectrum of magnitude in decibels versus frequency for a pulse shift with wrap around modification operation sequenced by a fundamental (LL) superframe and complementary (RR) superframe. In this example, a common mode peak power at the carrier frequency of 768 kHz shows a 25 dB reduction and spread spectral shape. Further, notches are introduced at 384 kHz, 1152 kHz, 1536 kHz and other harmonics, thereby reducing common mode noise, which reduces electromagnetic interference (EMI) and which avoids amplitude modulation interference (AMI) in adjacent AM receivers.

Figure 17:
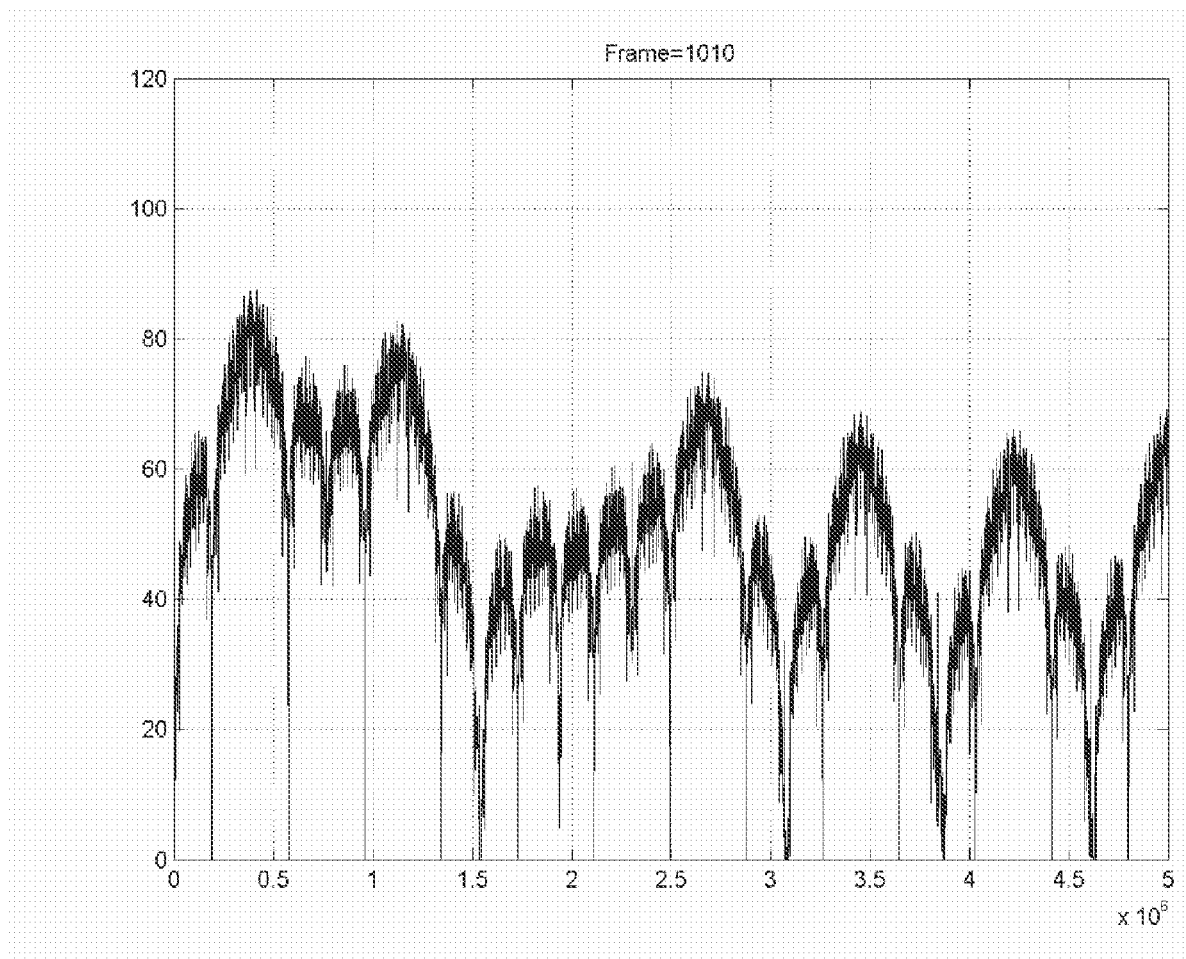
FIG. 17 is a graph of a particular illustrative embodiment of a common mode power spectrum of magnitude in decibels versus frequency for a pulse shift with wrap around modification operation sequenced by a fundamental (LRLR) superframe and a complementary (RLRL) superframe.

FIG. 17 is a graph 1700 of a particular illustrative embodiment of a common mode power spectrum of magnitude in decibels versus frequency for a pulse shift with wrap around modification operation sequenced by a fundamental (LRLR) superframe and complementary (RLRL) superframe. In this example, a common mode peak power at the carrier frequency of 768 kHz is reduced by more than 25 kHz. Further, greater length of the superframe places the notches closer together in frequency, thereby reducing or eliminating additional noise.

Figure 18:
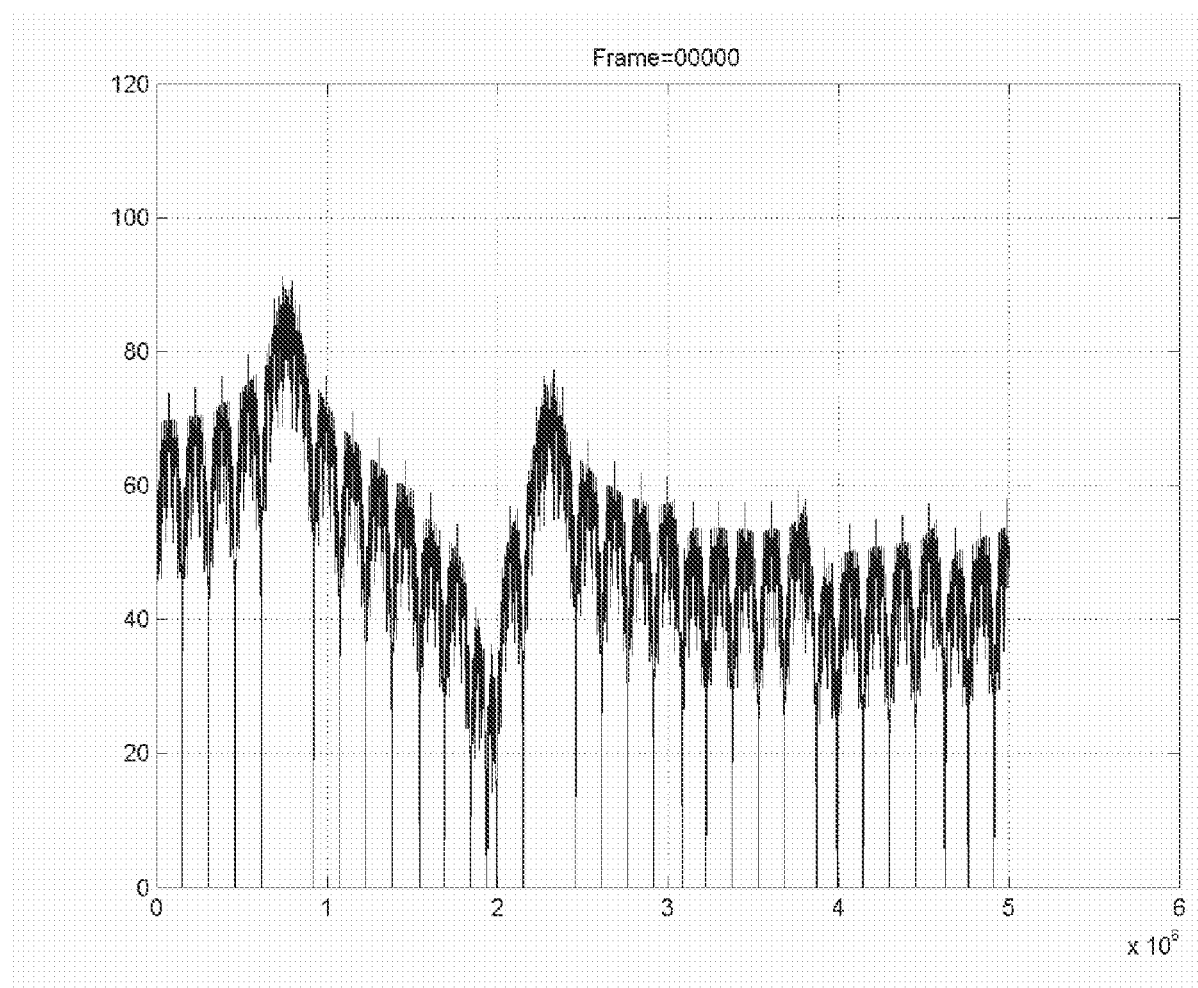
FIG. 18 is a graph of a particular illustrative embodiment of a common mode power spectrum of magnitude in decibels versus frequency for a pulse shift with wrap around modification operation sequenced by a fundamental (RRRRR) superframe and a complementary (LLLLL) superframe.

FIG. 18 is a graph 1800 of a particular illustrative embodiment of a common mode power spectrum of magnitude in decibels versus frequency for a pulse shift with wrap around modification operation sequenced by a fundamental (RRRRR) superframe and complementary (LLLLL) superframe. In this particular example, the length of the superframe places the notches even closer together. The graph 1700 illustrates a 25 dB reduction in common mode peak power at the carrier frequency of 768 kHz with a spread spectral shape around the carrier frequency. Further, the notches eliminate noise at various harmonics spaced at approximately ⅙th of the carrier frequency (for example, at 128 kHz, 256 kHz, 384 kHz, 512 kHz, and 896 kHz).

Figure 19:
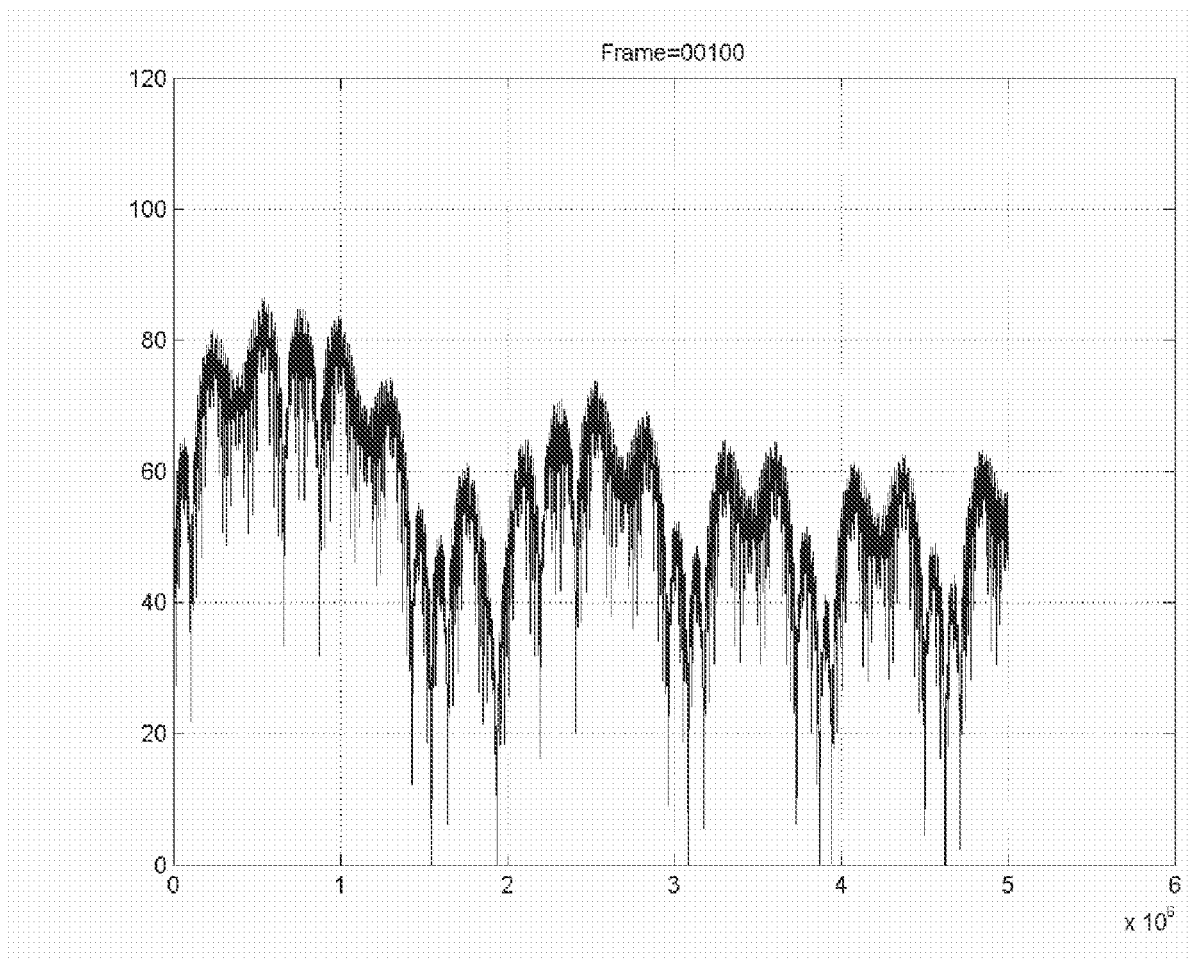
FIG. 19 is a graph of a particular illustrative embodiment of a common mode power spectrum of magnitude in decibels versus frequency for a pulse shift with wrap around modification operation sequenced by a fundamental (RRLRR) superframe and a complementary (LLRLL) superframe.

FIG. 19 is a graph 1900 of a particular illustrative embodiment of a common mode power spectrum of magnitude in decibels versus frequency for a pulse shift with wrap around modification operation sequenced by a fundamental (RRLRR) superframe and complementary (LLRLL) superframe. In this particular example, the notches are located at different controlled frequencies based on the particular pattern. The graph 1900 illustrates a 25 dB reduction in common mode peak power at the carrier frequency of 768 kHz with a spread spectral shape around the carrier frequency. Further, the notches eliminate noise at various controlled frequencies.

As previously mentioned, the above-examples illustrated in FIGS. 12-18 are based on application of a superframe (i.e., a controlled sequence of frames) using a pulse shift and wrap around modification operation to suppress the carrier. However, other techniques can also be used to suppress the carrier and other techniques can be used to control the modulation sequencing. In a particular example, the modulation sequencing, using the superframe concepts described above, can be applied to a chopped PWM signal, a pulse shift with no wrap around signal, a PWM signal with a suppressed carrier based on other carrier modulation techniques, or any combination thereof, to achieve results similar to those illustrated in FIGS. 14-19.

Figure 20:
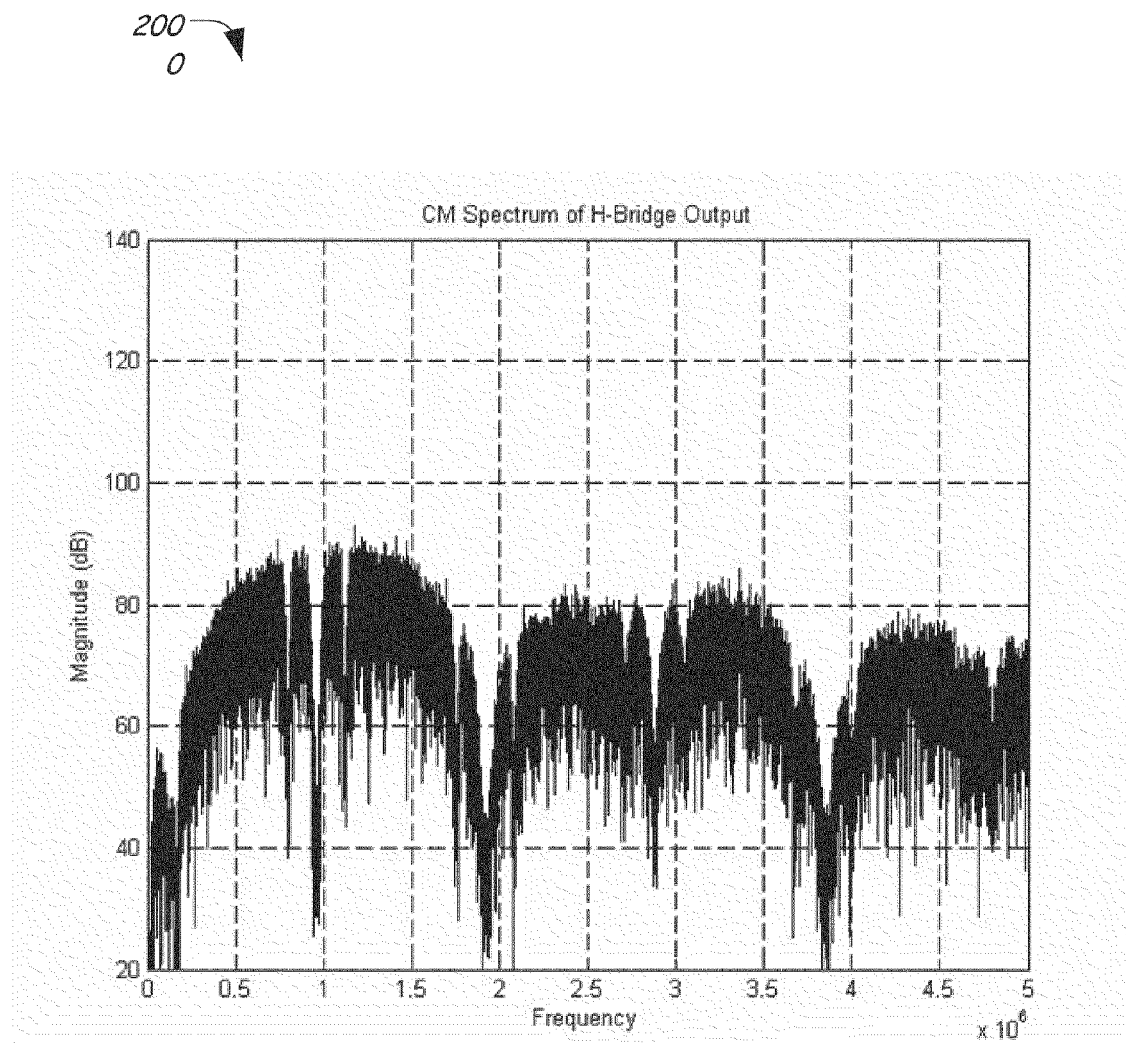
FIG. 20 is a graph of a particular illustrative embodiment of a PWM output power spectrum using a sigma delta filter in conjunction with carrier power suppression and an applied superframe technique.

FIG. 20 is a graph 2000 of a particular illustrative embodiment of a common mode power spectrum of magnitude in decibels versus frequency for a chopping modification operation sequenced by the output of a sigma delta modulator. In this particular example, the carrier frequency is 960 kHz and the notches are located at different specific frequencies based on sigma delta noise transfer function. The graph 2000 illustrates a 25 dB reduction in common mode peak power at the carrier frequency of 768 kHz with a spread spectral shape around the carrier frequency. Further, the notches further reduce the spread power an additional 20 dB at various specific frequencies.

As previously mentioned, the example illustrated in FIG. 20 is based on application of a modulation sequence controller based on a sigma delta modulator using a chopping modification operation to suppress the carrier. However, other techniques can also be used in conjunction with the sigma delta modulator to suppress the carrier. In a particular example, the modulation sequencing using the superframe concepts described above, can be applied to a pulse shift with wrap around signal, a pulse shift with no wrap around signal, a PWM signal with a suppressed carrier based on other carrier modulation techniques, or any combination thereof, to achieve results similar to that illustrated in FIG. 20.

Additionally, while the above-examples have been largely directed to audio applications that use a switched H-bridge circuit in conjunction with an associated speaker, it should be understood that PWM modulation sequencing techniques (i.e., techniques including selectively controlling a sequence of a PWM carrier suppression modulation operation) that is disclosed above can be applied in a large number of switching contexts to satisfy electromagnetic interference (EMI) compliance requirements and to reduce AM/FM radio band interference. In a particular example, the PWM modulation sequencing techniques can be applied in switched power supplies, data converters, motor control systems, other PWM applications, or any combination thereof.

In general, in conjunction with the systems and methods described above, a pulse width modulated signal can be modified with a sequence of operations, in which the operations suppress a PWM carrier power spectrum and associated harmonics, and grouped, according to a modulation sequencing pattern, to produce a modulated PWM output signal having an altered power spectrum and without substantially impacting a differential mode characteristic. In a particular example, modulation sequence controller logic may be used to repetitively apply a modification operation to produce an output signal having a suppressed PWM carrier with sideband tones located at different frequencies. In a particular illustrative embodiment, modulation sequence controller logic may be used to selectively apply a superframe pattern to a pulse shifted PWM signal to produce an output signal having reduced peak PWM carrier power.

In another particular embodiment, modulation sequence controller logic may be used to generate or select one or more superframe pattern and to periodically or randomly apply the one or more superframe patterns to produce an output signal having a reduced PWM carrier power spectrum at particular frequencies and with a desired spacing. In still another particular example, the modulation sequence controller logic is adapted to choose a superframe pattern and a superframe length to place one or more notches at one or more harmonics of a carrier frequency, thereby reducing electromagnetic interference and avoiding AM/FM radio interference due to PWM switching. In still another particular example, the modulation sequence controller logic uses a sigma delta modulator to spread the PWM carrier power spectrum and place one or more notches at one or more harmonics of a carrier frequency, thereby reducing electromagnetic interference and avoiding AM/FM radio interference due to PWM switching. In general, though the above-discussion has largely focused on a pulse shifted PWM signal, other modulation techniques can be selected to suppress a peak carrier power at particular frequencies, in conjunction with the selective application of PWM modulation sequencing (of selectively applied controlled sequences).

Although the present invention has been described with reference to preferred embodiments, workers skilled in the art will recognize that changes may be made in form and detail without departing from the spirit and scope of the invention.

What is claimed is:

1. A circuit device to produce an output signal with suppressed common mode carrier power, the circuit device comprising:
    differential inputs to receive differential pulse-width modulated (PWM) signals; and
    a pulse edge control circuit coupled to the differential inputs and configured to phase-shift or chop the differential PWM signals according to a control signal to generate a modulated PWM output signal with suppressed common mode carrier power.

2. The circuit device of claim 1, further comprising a sequence control circuit including a random number generator to generate a sequence of random numbers defining a pattern; and
    wherein the control signal comprises the pattern.

3. The circuit device of claim 2, wherein the sequence control circuit further comprises a delta-sigma modulator to adjust the sequence of random numbers to produce the control signal.

4. The circuit device of claim 2, wherein the sequence control circuit further comprises a sample and hold circuit coupled to the random number generator to store the sequence of random numbers and to control the switch circuit to selectively switch between the modified differential pair of PWM signals as a function of a carrier frequency of the differential PWM signals.

5. The circuit device of claim 4, wherein the sequence control circuit controls the switch circuit to repeat the pattern at a selectable rate.

6. The circuit device of claim 1, further comprising a sequence control circuit to generate the control signal, the control circuit comprising:
    a pattern lookup table including a plurality of binary patterns that define notches at particular output frequencies when applied to PWM signals;
    pattern selection logic configured to select a binary pattern from the pattern lookup table that produces a notch at a desired output frequency; and
    a pattern generator to produce the control signal comprising the selected binary pattern, the pattern generator to provide the control signal to the pulse edge control circuit.

7. The circuit device of claim 1, further comprising a sequence control circuit to generate the sequence control signal comprising:
    pattern selection logic configured to produce a select signal;
    a pattern generator configured to produce a pattern; and
    a multiplexer configured to receive the second pattern and to selectively output the control signal comprising the pattern based on the second pattern according to the select signal.

8. The circuit device of claim 1, wherein the control signal comprises a pattern including two or more symbols.

9. The circuit device of claim 8, wherein the pulse edge control circuit is configured to phase shift the differential PWM signals by a negative phase offset from a center of a PWM frame in response to a symbol of the pattern having a first value and to phase shift the differential PWM signals by a positive phase offset from the center in response to the symbol of the pattern having a second value.

10. A method of altering a power spectrum of a signal, the method comprising the acts of:

receiving a pulse-width modulated (PWM) signal at a pulse edge controller of a circuit device;

receiving a control signal defining a pattern at the pulse edge controller; and in response to receiving the control signal, selectively modifying the received PWM signal according to the pattern to produce a modulated PWM output signal having an altered power spectrum relative to a power spectrum of the received PWM signal.

11. The method of claim 10, wherein the pattern comprises a random pattern, and wherein energy at a carrier frequency of the received PWM signal is spectrally spread across frequencies of the power spectrum to produce the modulated PWM output signal with the altered power spectrum.

12. The method of claim 10, wherein the pattern comprises a periodic pattern, and wherein peak energy at a carrier frequency of the modulated PWM output signal is suppressed.

13. The method of claim 10, further comprising selecting the pattern to introduce a frequency notch at a desired frequency.

14. The method of claim 10, wherein the act of selectively modulating the received PWM signal comprises phase-shifting selected PWM pulses of the received PWM signal early or late according to the pattern to produce the modulated PWM output signal.

15. The method of claim 10, wherein the act of selectively modulating the received PWM signal comprises selectively chopping or not chopping the received PWM signal according to the pattern to produce the modulated PWM output signal.

16. An apparatus to produce a modulated PWM signal, the apparatus comprising:

a control circuit configured to generate a control signal including a pattern of symbols; and a pulse edge control circuit configured to receive a PWM signal and, in response to the control signal, to perform a sequence of phase-shift operations or chopping operations on the PWM signal to produce a modulated PWM signal, the sequence corresponding to the pattern of symbols.

17. The apparatus of claim 16, wherein the symbols comprise binary values.

18. The apparatus of claim 16, wherein the pattern of symbols comprises a binary pattern of alternating one values and zero values.

19. The apparatus of claim 18, wherein the modulated PWM signal has a power spectrum including a reduced peak power at a carrier frequency relative to a power spectrum of the received PWM signal.

20. The apparatus of claim 17, wherein the pattern comprises a random pattern of symbols.

21. The apparatus of claim 20, wherein the modulated PWM signal has a modified power spectrum having spectrally spread energy relative to a power spectrum of the received PWM signal.

22. A method of altering a power spectrum of a signal, the method comprising the acts of:

receiving a pulse-width modulated (PWM) signal;

modifying the PWM signal to produce a modulated PWM signal with suppressed carrier power and associated harmonics; and selectively controlling a modification sequence associated with producing the modulated PWM signal to selectively alter a PWM carrier power spectrum to produce a modulated PWM output signal having at least one of a reduced peak carrier power and frequency notches at particular frequencies.

23. The method of claim 22, wherein the act of selectively controlling the modification sequence comprises spreading energy associated with a PWM carrier frequency to other frequency bands in the modulated PWM output signal.

24. The method of claim 22, wherein the act of selectively controlling the modification sequence comprises randomly adjusting the modification sequence to suppress a peak power at a PWM carrier frequency within the modulated PWM output signal.

25. The method of claim 22, wherein the act of selectively controlling the modification sequence includes controlling a sequencing of a phase-shifting or chopping operation to selectively place the frequency notches at particular frequencies of the modulated PWM output signal.

26. The method of claim 25, wherein the frequency notches are placed at the particular frequencies in a power spectrum of the modulated PWM output signal.

27. The method of claim 22, wherein the act of selectively controlling the modification sequence includes controlling the sequencing of the phase-shifting or chopping operation to reduce radiated interference with nearby receiver circuitry at a common mode carrier frequency and its harmonics.

28. A circuit device comprising:

a differential switching amplifier including at least one positive input and at least one negative input and a differential output coupled to a load;

a pulse edge control circuit coupled to the at least one positive input and the at least one negative input of the switching amplifier to receive differential PWM signals and including a modulation control input to receive a modulation control signal, the pulse edge control circuit adapted to phase-shift or chop the differential PWM signals to produce a modulated PWM output signal with suppressed common mode carrier power and associated harmonics; and a modulation sequence controller coupled to the modulation control input to selectively control a sequencing of the phase-shifting or chopping operation to selectively alter a common mode power spectrum of the modulated PWM output signal.

29. The circuit device of claim 28, wherein the modulation sequence controller is configured to generate a pattern, wherein the modulation sequence controller controls the sequencing according to the pattern.

30. The circuit device of claim 29, wherein the modulation sequence controller is adapted to generate a complementary pattern that comprises a complement of the pattern, wherein the modulation sequence controller controls the sequencing by selectively applying one of the pattern and the complementary pattern.

31. The circuit device of claim 30, wherein the modulation sequence controller alternates between the pattern and the complementary pattern to control the sequencing.

32. The circuit device of claim 30, wherein the modulation sequence controller randomly selects between the pattern and the complementary pattern to control the sequencing.

33. The circuit device of claim 28, wherein the modulation sequence controller is adapted to selectively apply one or more patterns to control the sequencing of a phase-shifting or chopping operation to shape the common mode power spectrum of the modulated PWM output signal.

34. The circuit device of claim 28, wherein the modulation sequence controller is adapted to selectively apply one or more patterns to control the sequencing of a phase-shifting or chopping operation to shape the common mode power spectrum to include notches at particular frequencies.

35. The circuit device of claim 28, wherein the modulation sequence controller is adapted to selectively apply one or more patterns to control the sequencing of a phase-shifting or chopping operation to shape the common mode power spectrum to reduce radiated interference with nearby receiver circuitry at a selected frequency.

* * * * *